United States Patent
Chen et al.

(10) Patent No.: US 12,193,248 B2
(45) Date of Patent: Jan. 7, 2025

(54) ORGANIC LIGHT EMITTING DEVICE AND DISPLAY APPARATUS

(71) Applicant: BOE Technology Group Co., Ltd., Beijing (CN)

(72) Inventors: Lei Chen, Beijing (CN); Lixia Qiu, Beijing (CN); Kun Ma, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 761 days.

(21) Appl. No.: 17/439,406

(22) PCT Filed: Dec. 11, 2020

(86) PCT No.: PCT/CN2020/135537
§ 371 (c)(1),
(2) Date: Sep. 15, 2021

(87) PCT Pub. No.: WO2022/120773
PCT Pub. Date: Jun. 16, 2022

(65) Prior Publication Data
US 2022/0376198 A1 Nov. 24, 2022

(51) Int. Cl.
*H01L 51/50* (2006.01)
*H10K 50/11* (2023.01)
(Continued)

(52) U.S. Cl.
CPC .............. *H10K 50/11* (2023.02); *H10K 50/12* (2023.02); *H10K 50/18* (2023.02); *H10K 85/615* (2023.02);
(Continued)

(58) Field of Classification Search
None
See application file for complete search history.

(56) References Cited

U.S. PATENT DOCUMENTS

2017/0213968 A1 7/2017 Park et al.
2018/0282295 A1 10/2018 Parham et al.
(Continued)

FOREIGN PATENT DOCUMENTS

CN 106537634 A 3/2017
CN 107108500 A 8/2017
(Continued)

*Primary Examiner* — Gregory D Clark
(74) *Attorney, Agent, or Firm* — Ling Wu; Stephen Yang; Ling and Yang Intellectual Property

(57) ABSTRACT

Provided are an organic light emitting device and a display apparatus. An organic light emitting device includes an anode, a cathode, and an emitting layer disposed between the anode and the cathode; wherein the emitting layer includes a host material and a dopant material doped in the host material; the host material includes a first host material and a second host material, and the first host material, the second host material, the electron block layer, and the hole block layer satisfy:

$|HOMO_{1-host} - HOMO_{EBL}| \leq 0.2$ eV, $|LUMO_{HBL} - LUMO_{2-host}| \leq 0.2$ eV, wherein, $HOMO_{1-host}$ is a HOMO energy level of the first host material; $HOMO_{EBL}$ is a HOMO energy level of the electron block layer; $LUMO_{2-host}$ is a LUMO energy level of the second host material, and $LUMO_{HBL}$ is a LUMO energy level of the hole block layer.

20 Claims, 5 Drawing Sheets

(51) Int. Cl.
    *H10K 50/12*    (2023.01)
    *H10K 50/18*    (2023.01)
    *H10K 85/60*    (2023.01)
    *H10K 101/40*    (2023.01)
(52) U.S. Cl.
    CPC ......... *H10K 85/624* (2023.02); *H10K 85/633* (2023.02); *H10K 85/654* (2023.02); *H10K 85/6572* (2023.02); *H10K 85/6574* (2023.02); *H10K 2101/40* (2023.02)

(56) References Cited

U.S. PATENT DOCUMENTS

| | | |
|---|---|---|
| 2020/0119285 A1 | 4/2020 | No et al. |
| 2020/0212312 A1 | 7/2020 | Kang et al. |
| 2020/0365811 A1 | 11/2020 | Kawamura et al. |
| 2021/0188816 A1 | 6/2021 | Park et al. |

FOREIGN PATENT DOCUMENTS

| | | | |
|---|---|---|---|
| CN | 109385266 A | 2/2019 | |
| CN | 109535138 A | 3/2019 | |
| CN | 109928887 A | 6/2019 | |
| CN | 110003091 A | 7/2019 | |
| CN | 110416422 A | 11/2019 | |
| CN | 110520420 A | 11/2019 | |
| CN | 111509132 A | 8/2020 | |
| CN | 111635324 A | 9/2020 | |
| CN | 111662258 A | 9/2020 | |
| CN | 111747894 A | 10/2020 | |
| CN | 111747905 A | 10/2020 | |
| CN | 111943857 A | 11/2020 | |
| CN | 112166112 A | 1/2021 | |
| EP | 3670517 A1 | 6/2020 | |
| JP | 2020-143169 A | 9/2020 | |
| WO | 2018123924 A1 | 7/2018 | |
| WO | 2019245263 A1 | 12/2019 | |
| WO | 2020169241 A1 | 8/2020 | |
| WO | 2020171532 A1 | 8/2020 | |
| WO | WO 2021/171532 * | 8/2020 | ............. H01L 51/50 |

\* cited by examiner

ORGANIC LIGHT EMITTING DEVICE AND DISPLAY APPARATUS

TECHNICAL FIELD

The present disclosure relates to, but is not limited to, the technical field of display, in particular to an organic light emitting device and a display apparatus.

BACKGROUND

An Organic Light Emitting Device (abbreviated as an OLED) as a new type of flat panel display is gradually receiving increasing attention. OLED is an active light emitting device, with advantages of high brightness, color saturation, ultra-thin, wideview, low power consumption, high response speed and flexibility.

OLED includes an anode, a cathode and an emitting layer disposed between the anode and the cathode. Its light-emitting principle is that holes and electrons are injected into the emitting layer from the anode and the cathode respectively. When the electrons and holes meet in the emitting layer, the electrons and holes recombine to generate excitons, and these excitons emit light while changing from excited state to ground state.

SUMMARY

The following is a summary of subject matter described in detail herein. This summary is not intended to limit the protection scope of the claims.

An organic light emitting device includes an anode, a cathode, and an emitting layer disposed between the anode and the cathode, wherein an electron block layer is disposed between the emitting layer and the anode, and a hole block layer is disposed between the emitting layer and the cathode; wherein the emitting layer includes a host material and a dopant material doped in the host material; the host material includes a first host material and a second host material; and the first host material, the second host material, the electron block layer, and the hole block layer satisfy:

$|HOMO_{1\text{-}host}\text{-}HOMO_{EBL}| \leq 0.2$ eV, $|LUMO_{HBL}\text{-}LUMO_{2\text{-}host}| \leq 0.2$ eV.

$HOMO_{1\text{-}host}$ is a highest occupied molecular orbital HOMO energy level of the first host material; $HOMO_{EBL}$ is a HOMO energy level of the electron block layer; $LUMO_{2\text{-}host}$ is a lowest unoccupied molecular orbital LUMO energy level of the second host material, and $LUMO_{HBL}$ is a LUMO energy level of the hole block layer.

In an exemplary embodiment, the first host material and the hole block layer may satisfy:

$|LUMO_{HBL}\text{-}LUMO_{1\text{-}host}| = 0.3$ eV to $0.4$ eV.

$LUMO_{1\text{-}host}$ is a LUMO energy level of the first host material.

In an exemplary embodiment, the second host material and the hole block layer may satisfy:

$|HOMO_{HBL}\text{-}HOMO_{2\text{-}host}| \geq 0.3$ eV.

$HOMO_{HBL}$ is a HOMO energy level of the hole block layer and $HOMO_{2\text{-}host}$ is a HOMO energy level of the second host material.

In an exemplary embodiment, hole mobility of the electron block layer is greater than electron mobility of the electron block layer.

In an exemplary embodiment, the hole mobility of the electron block layer is $10^{-4}$ cm$^2$/Vs to $10^{-6}$ cm$^2$/Vs, and the electron mobility of the electron block layer is less than $10^{-8}$ cm$^2$/Vs.

In an exemplary embodiment, the hole mobility of the electron block layer is greater than 10 times that of the first host material.

In an exemplary embodiment, the hole mobility of the electron block layer is greater than electron mobility of the second host material.

In an exemplary embodiment, electron mobility of the hole block layer is greater than hole mobility of the hole block layer.

In an exemplary embodiment, the hole mobility of the first host material is $10^{-5}$ cm$^2$/Vs to $10^{-7}$ cm$^2$/Vs, the electron mobility of the second host material is $10^{-8}$ cm$^2$/Vs to $10^{-9}$ cm$^2$/Vs, and the electron mobility of the hole block layer is $10^{-7}$ cm$^2$/Vs to $10^{-9}$ cm$^2$/Vs.

In an exemplary embodiment, in the host material, a mixing ratio of the first host material and the second host material is 2:8 to 8:2.

In an exemplary embodiment, the first host material includes a p-type emitting material, and the second host material includes an n-type emitting material.

In an exemplary embodiment, a material of the electron block layer includes a compound having the following structural formula:

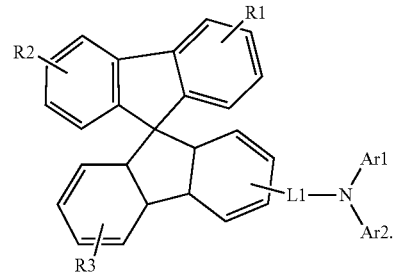

Ar1 to Ar2 are independently substituted or unsubstituted aryl group with 6-30 ring carbon atoms or substituted or unsubstituted heteroaryl group with 5-20 ring atoms, and at least one of them is methyl fluorene, dibenzofuran or thiophene; L1 is a single bond or substituted aryl containing 6-30 carbon atoms; R1 to R3 are independently substituted or unsubstituted alkyl or aryl with 1-30 ring carbon atoms, or substituted or unsubstituted heteroaryl with 5-20 ring atoms.

In an exemplary embodiment, a material of the electron block layer includes one or more of compounds having the following structural formulas:

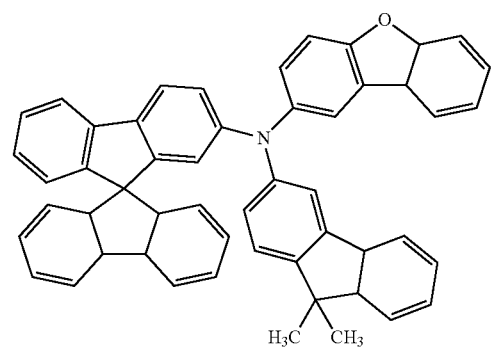

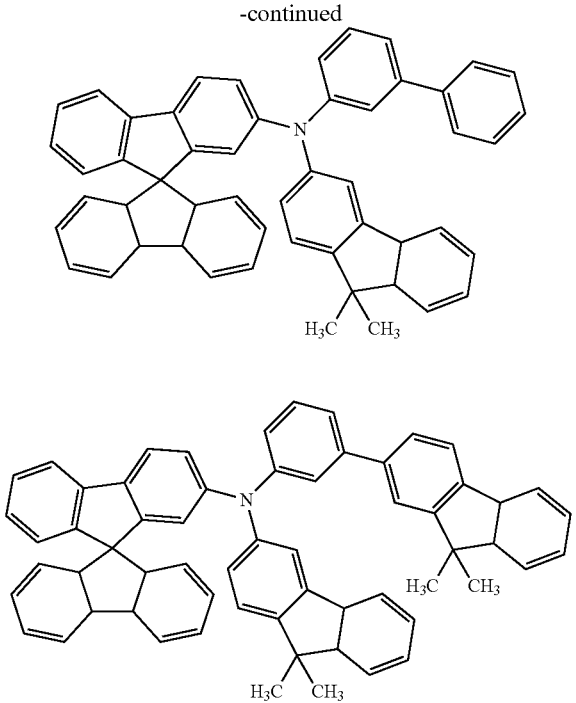

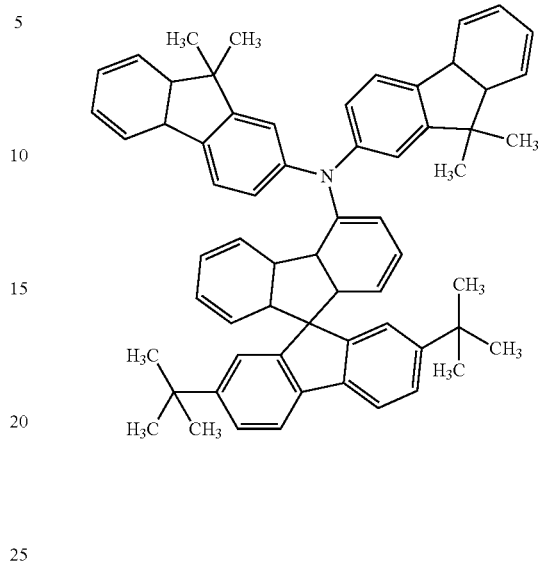

In an exemplary embodiment, the first host material includes a compound having the following structural formula:

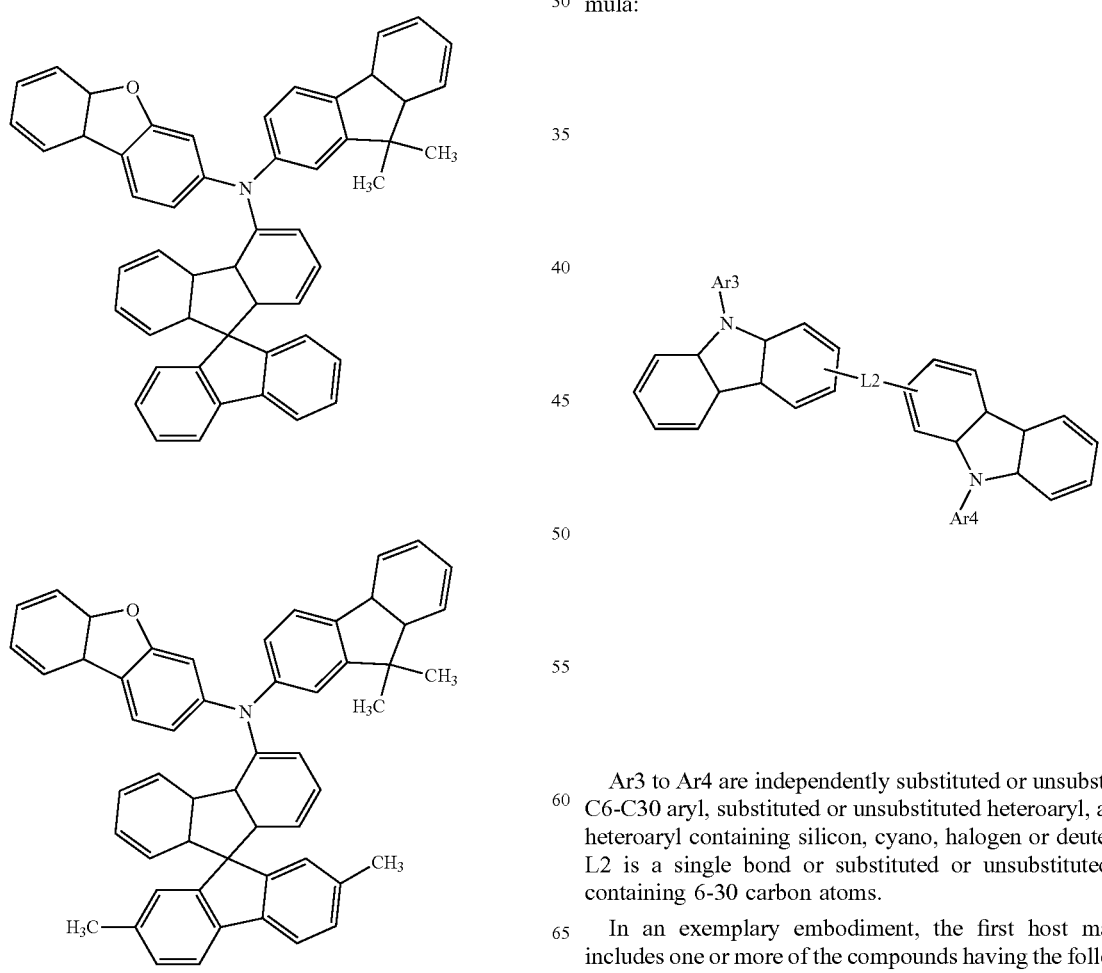

Ar3 to Ar4 are independently substituted or unsubstituted C6-C30 aryl, substituted or unsubstituted heteroaryl, aryl or heteroaryl containing silicon, cyano, halogen or deuterium; L2 is a single bond or substituted or unsubstituted aryl containing 6-30 carbon atoms.

In an exemplary embodiment, the first host material includes one or more of the compounds having the following structural formulas:

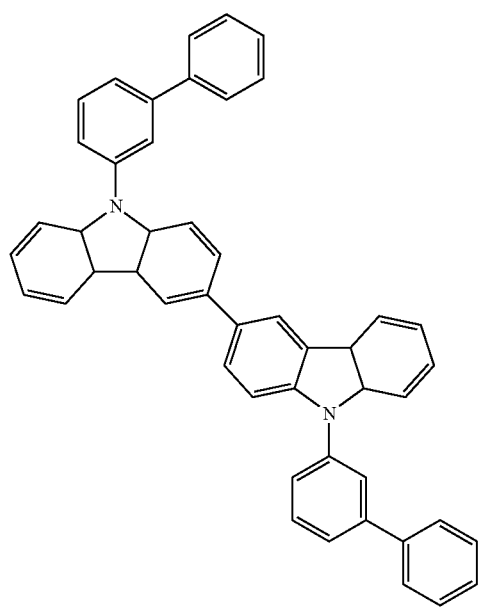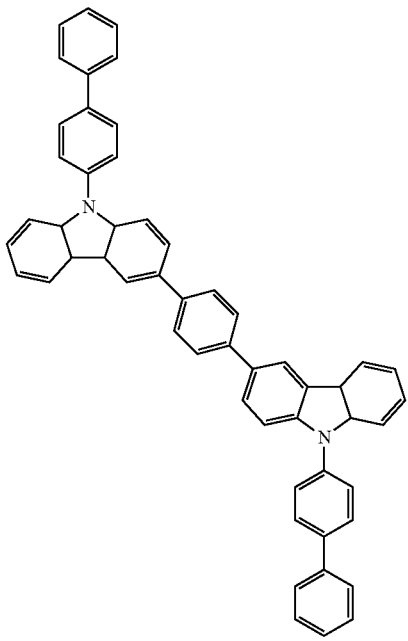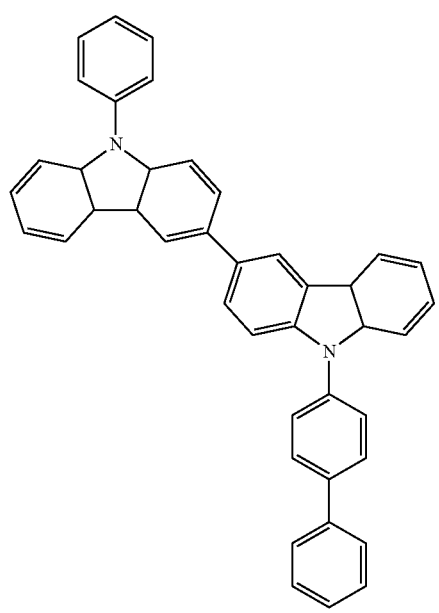

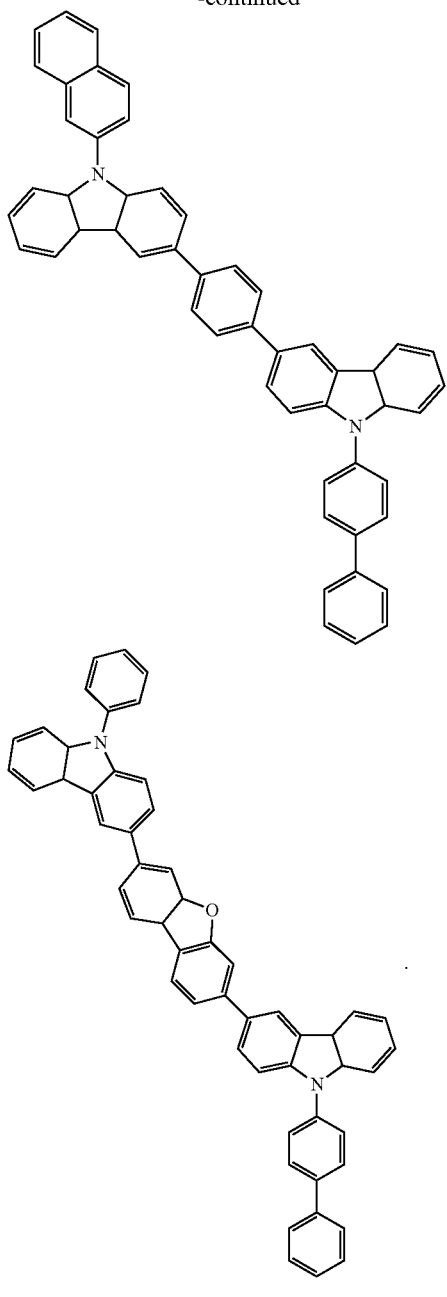

In an exemplary embodiment, the second host material includes a compound having the following structural formula:

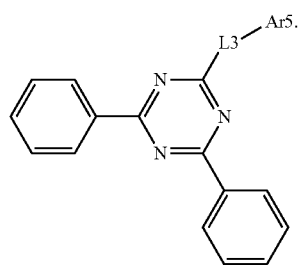

Ar5 is substituted or unsubstituted aryl or heteroaryl with 6-30 carbon atoms, or contains carbazole, dibenzofuran and thiophene; L3 is aryl with 6-20 carbon atoms.

In an exemplary embodiment, the second host material includes one or more of the compounds having the following structural formulas:

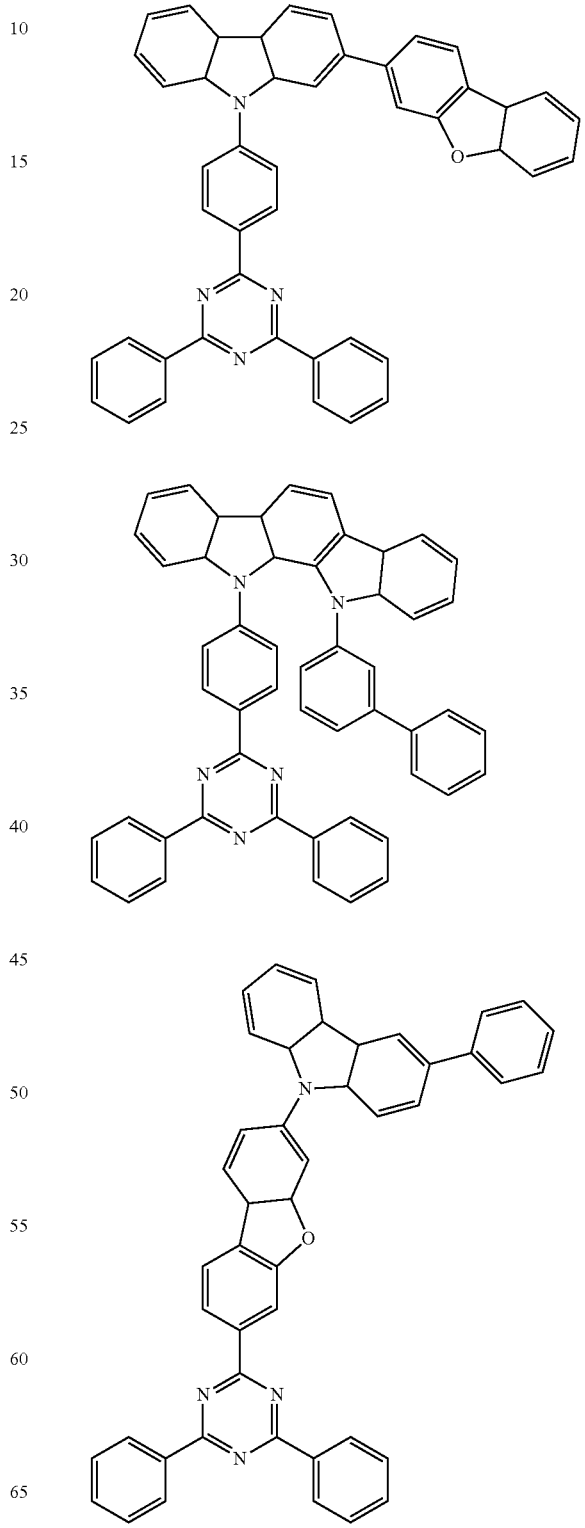

-continued

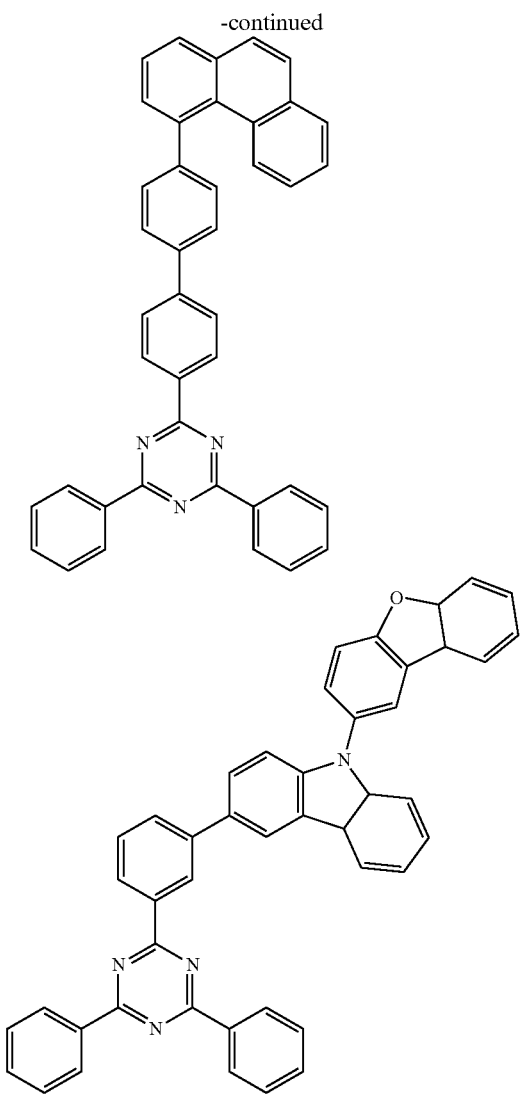

A display apparatus includes the aforementioned organic light emitting device.

Other aspects will become apparent upon reading and understanding accompanying drawings and the detailed description.

BRIEF DESCRIPTION OF DRAWINGS

The attached drawings are for providing a further understanding of the technical scheme of the present disclosure and constitute a part of the description. They are for explaining the technical scheme of the present disclosure together with the embodiments of the present application and do not constitute a limitation on the technical scheme of the present disclosure. Shapes and sizes of various components in the drawings do not reflect true scales and are intended to illustrate schematically contents of the present disclosure only.

DETAILED DESCRIPTION

Figure 1:
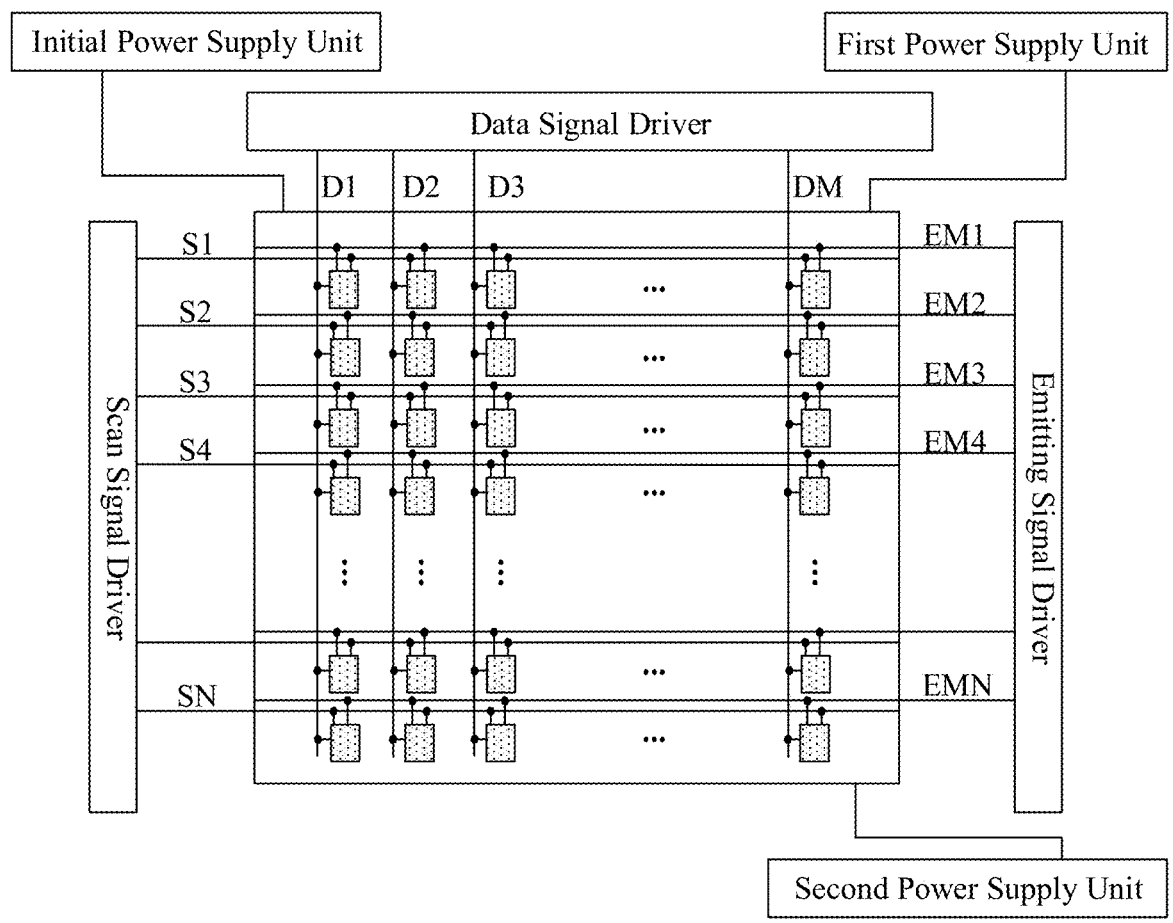
FIG. 1 is a schematic diagram of a structure of an OLED display apparatus.

The embodiments herein may be implemented in a number of different ways. A person of ordinary skills in the art will readily understand the fact that implementations and contents may be transformed into a variety of forms without departing from the spirit and scope of the present disclosure. Therefore, the present disclosure should not be construed as being limited only to what is described in the following embodiments. The embodiments and features in the embodiments in the present disclosure may be combined randomly if there is no conflict.

In the drawings, a size of a constituent element, a thickness of a layer or an area of the layer may be sometimes exaggerated for clarity. Therefore, any implementation mode of the present disclosure is not necessarily limited to a size shown in the drawings, and the shapes and sizes of the components in the drawings do not reflect true proportions. In addition, the drawings schematically show ideal examples, and any implementation mode of the present disclosure is not limited to the shapes or values shown in the drawings.

In this disclosure, the "first", "second", "third" and other ordinal numbers are used to avoid confusion of constituent elements, but not to limit in quantity.

In the present disclosure, for sake of convenience, wordings such as "central", "upper", "lower", "front", "rear", "vertical", "horizontal", "top", "bottom", "inner", "outer" and the like describe the orientations or positional relations of constituent elements with reference to the drawings, which are only for ease of description of this specification and for simplification of the description, rather than indicating or implying that the apparatus or element referred to must have a specific orientation, or must be constructed and operated in a particular orientation, and therefore cannot be construed as limitations on the present disclosure. The positional relations of the constituent elements may be appropriately changed according to the direction in which each constituent element is described. Therefore, they are not limited to the wordings in this disclosure, and may be replaced appropriately according to the situations.

In the present disclosure, the terms "installed", "connected" and "coupled" shall be broadly understood unless otherwise explicitly specified and defined. For example, a connection may be a fixed connection, or a detachable connection, or an integrated connection; it may be a mechanical connection, or an electrical connection; it may be a direct connection, or an indirect connection through middleware, or an internal connection between two elements. Those of ordinary skills in the art can understand the specific meanings of the above terms in the present disclosure according to situations.

In the present disclosure, a transistor refers to an element that includes at least three terminals: a gate electrode, a drain electrode, and a source electrode. The transistor has a channel region between the drain electrode (or referred to as a drain electrode terminal, a drain region or a drain electrode) and the source electrode (or referred to as a source electrode terminal, a source region or a source electrode), and a current can flow through the drain electrode, the channel region and the source electrode. In this disclosure, the channel region refers to a region through which a current mainly flows.

In the present disclosure, the first electrode may be a drain electrode and the second electrode may be a source electrode, or the first electrode may be a source electrode and the second electrode may be a drain electrode. In a situation where transistors with opposite polarities are used or a current direction is changed in an operation of a circuit, a function of the "source electrode" and a function of the "drain electrode" can sometimes be interchangeable. Therefore, the "source electrode" and the "drain electrode" can be interchangeable in this disclosure.

In the present disclosure, an "electrical connection" includes a case where constituent elements are connected via an element having a certain electrical action. The "element with a certain electric action" is not particularly limited as long as it can transmit and receive electrical signals between the connected constituent elements. An "element with a certain electrical action" may be, for example, an electrode or wiring, a switching element such as a transistor, or other functional elements such as a resistor, an inductor or a capacitor, etc.

Herein, "parallel" refers to a state in which two straight lines form an angle of −10° or more and 10° or less, and thus also includes a state in which the angle is −5° or more and 5° or less. In addition, "perpendicular" refers to a case where an angle formed by two straight lines is above −80° and below 100°, and thus also includes a case where the angle is above −85° and below 95°.

In the present disclosure, a "film" and a "layer" are interchangeable. For example, sometimes "conductive layer" may be replaced by "conductive film". Similarly, "insulating film" may sometimes be replaced by "insulating layer".

The wording "about" herein means that the limit is not strictly set, and a value within the range of process and measurement errors is allowed.

FIG. 1 is a schematic structural diagram of an OLED display apparatus. As shown in FIG. 1, the OLED display apparatus may include a scan signal driver, a data signal driver, an emitting signal driver, an OLED display panel, a first power supply unit, a second power supply unit and an initial power supply unit. In an exemplary embodiment, the OLED display substrate at least includes a plurality of scan signal wires (S1 to SN), a plurality of data signal wires (D1 to DM) and a plurality of emitting signal wires (EM1 to EMN); the scan signal driver is configured to sequentially supply scan signals to the plurality of scan signal wires (S1 to SN), the data signal driver is configured to supply data signals to the plurality of data signal wires (D1 to DM), and the emitting signal driver is configured to sequentially supply emitting control signals to the plurality of emitting signal wires (EM1 to EMN). In an exemplary embodiment, the plurality of scan signal wires and the plurality of emitting signal wires extend along a horizontal direction, and the plurality of data signal wires extend along a vertical direction. The display apparatus includes a plurality of sub-pixels. One sub-pixel includes a pixel drive circuit and an emitting device. The pixel drive circuit is connected to a scan signal wire, an emitting control line, and a data signal wire. The pixel drive circuit is configured to receive data voltage transmitted by the data signal wire under control of the scan signal wire and the emitting signal wire, and output a corresponding current to the emitting device, the emitting device is connected to the pixel drive circuit, and the emitting device is configured to emit light of corresponding brightness in response to the current output by the pixel drive circuit. The first power supply unit, the second power supply unit and the initial power supply unit are respectively configured to supply a first power supply voltage, a second power supply voltage and an initial power supply voltage to a pixel drive circuit through a first power supply line, a second power supply line and an initial signal wire.

Figure 2:
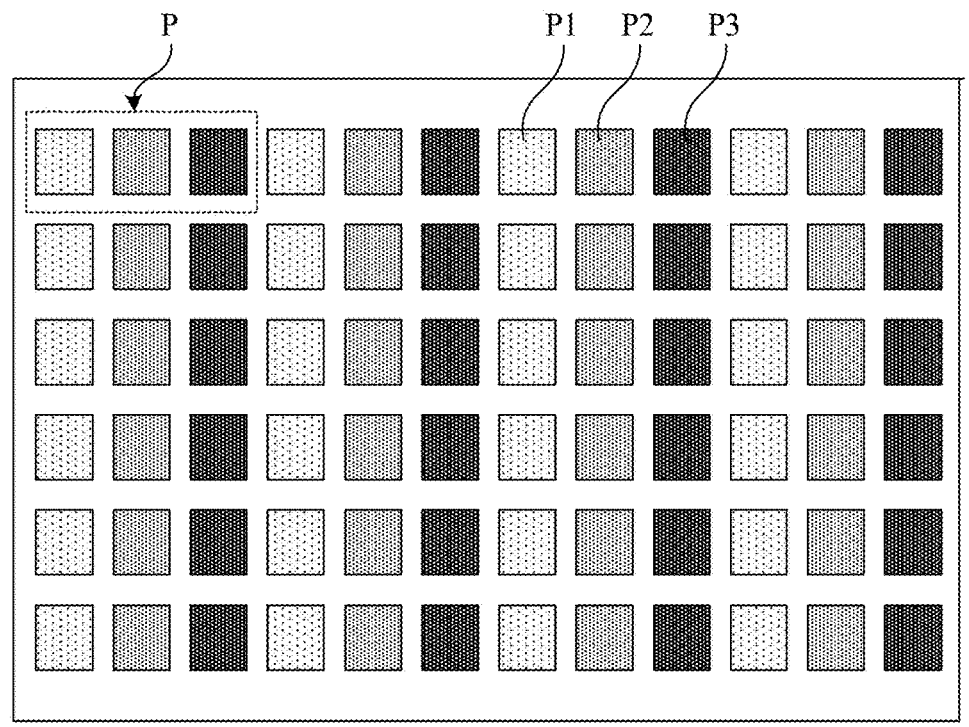
FIG. 2 is a schematic diagram of a planar structure of a display substrate.

FIG. 2 is a schematic diagram of a planar structure of a display substrate. As shown in FIG. 2, the display area may include a plurality of pixel units P arranged in a matrix, at least one of which includes a first sub-pixel P1 emitting light of a first color, a second sub-pixel P2 emitting light of a second color, and a third sub-pixel P3 emitting light of a third color. The first sub-pixel P1, the second sub-pixel P2, and the third sub-pixel P3 each include a pixel drive circuit and a light-emitting device. In an exemplary embodiment, the pixel unit p may include red (R), green (G) and blue (B) sub-pixels, or may include red, green, blue and white (W) sub-pixels, which is not limited in the present disclosure. In an exemplary embodiment, a shape of the sub-pixel in the pixel unit may be rectangular, diamond, pentagonal or hexagonal. When the pixel unit includes three sub-pixels, the three sub-pixels may be arranged in a manner to stand side by side horizontally, in a manner to stand side by side vertically, or in a pyramid manner with two units sitting at the bottom and one unit placed on top. When the pixel unit includes four sub-pixels, the four sub-pixels may be arranged in a manner to stand side by side horizontally, in a manner to stand side by side vertically, or in a manner to form a square, which is not specifically limited in the present disclosure.

Figure 3:
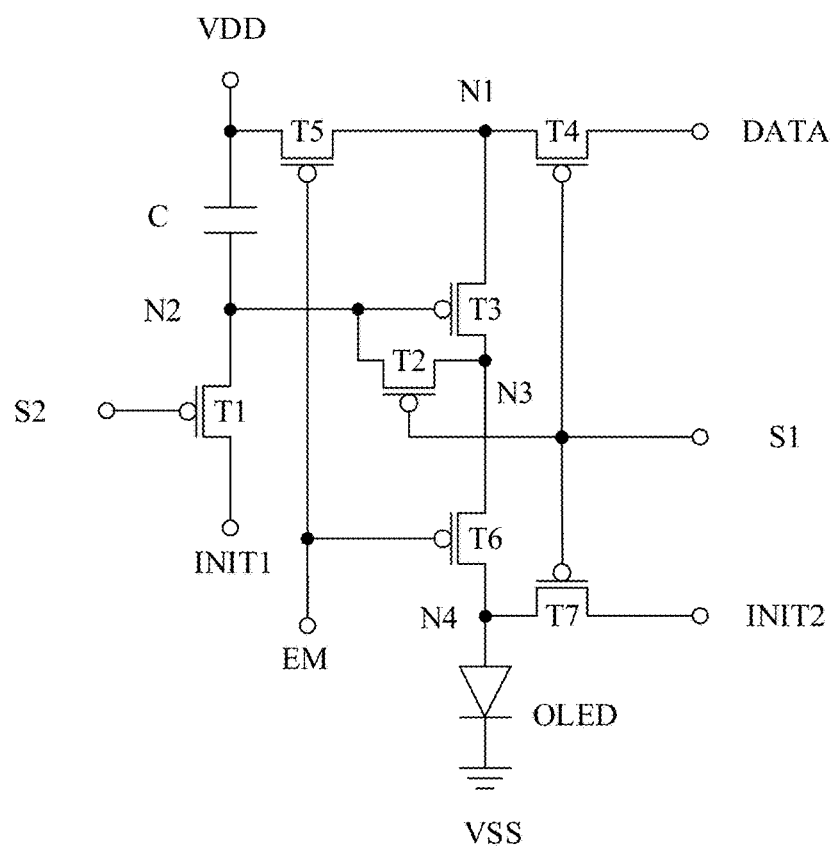
FIG. 3 is an equivalent circuit diagram of a pixel drive circuit.

In an exemplary implementation, the pixel drive circuit may have a structure of 3T1C, 4T1C, 5T1C, 5T2C, 6T1C or 7T1C. FIG. 3 is an equivalent circuit diagram of a pixel driving circuit. As shown in FIG. 3, the pixel drive circuit may include seven switch transistors (a first transistor T1 to a seventh transistor T7), a storage capacitor C and eight signal wires (a data signal wire DATA, a first scan signal wire S1, a second scan signal wire S2, a first initial signal wire INIT1, a second initial signal wire INIT2, a first power supply line VSS, a second power supply line VDD and an emitting signal wire EM). The first initial signal wire INIT1 and the second initial signal wire INIT2 may be the same signal wire.

In an exemplary implementation, a control electrode of the first transistor T1 is connected to the second scan signal wire S2, a first electrode of the first transistor T1 is connected to the first initial signal wire INIT1, and a second electrode of the first transistor is connected to a second node N2. A control electrode of the second transistor T2 is connected to the first scan signal wire S1, a first electrode of the second transistor T2 is connected to the second node N2, and a second electrode of the second transistor T2 is connected to a third node N3. A control electrode of the third transistor T3 is connected to the second node N2, a first electrode of the third transistor T3 is connected to the first node N1, and a second electrode of the third transistor T3 is connected to the third node N3. A control electrode of the fourth transistor T4 is connected to the first scan signal wire S1, a first electrode of the fourth transistor T4 is connected to the data signal wire DATA, and a second electrode of the fourth transistor T4 is connected to the first node N1. A control electrode of the fifth transistor T5 is connected to the emitting signal wire EM, a first electrode of the fifth transistor T5 is connected to the second power supply line VDD, and a second electrode of the fifth transistor T5 is connected to the first node N1. A control electrode of the sixth transistor T6 is connected to the emitting signal wire EM, a first electrode of the sixth transistor T6 is connected to the third node N3, and a second electrode of the sixth transistor T6 is connected to a first electrode of the light-emitting device. A control electrode of the seventh transistor T7 is connected to the first scan signal wire S1, a first electrode of the seventh transistor T7 is connected to the second initial signal wire INIT2, and a second electrode of the seventh transistor T7 is connected to the first electrode of the light-emitting device. A first end of the storage capacitor C is connected to the second power supply line VDD, and a second end of the storage capacitor C is connected to the second node N2.

In an exemplary implementation, the first transistor T1 to the seventh transistor T7 may be P-type transistors or may be N-type transistors. Adopting transistors of the same type in the pixel drive circuit may simplify a process flow, reduce difficulty in a preparation process of the display panel, and improve a product yield rate. In some possible implementations, the first transistor T1 to the seventh transistor T7 may include P-type transistors and N-type transistors.

In an exemplary implementation, a second electrode of the light emitting device is connected to the first power supply line VSS. A signal on the first power supply line VSS is a low level signal, and a signal on the second power supply line VDD is a high level signal that is continuously supplied. The first scan signal wire S1 is a scan signal wire for a pixel drive circuit of a current display row, and the second scan signal wire S2 is a scan signal wire for a pixel drive circuit of a previous display row. That is, for an nth display row, the first scan signal wire S1 is S(n), the second scan signal wire S2 is S(n-1), the second scan signal wire S2 of the current display row and the first scan signal wire S1 for the pixel drive circuit of the previous display row are the same signal wire, which may reduce the signal wires of the display panel and realize the narrow frame of the display panel.

Figure 4:
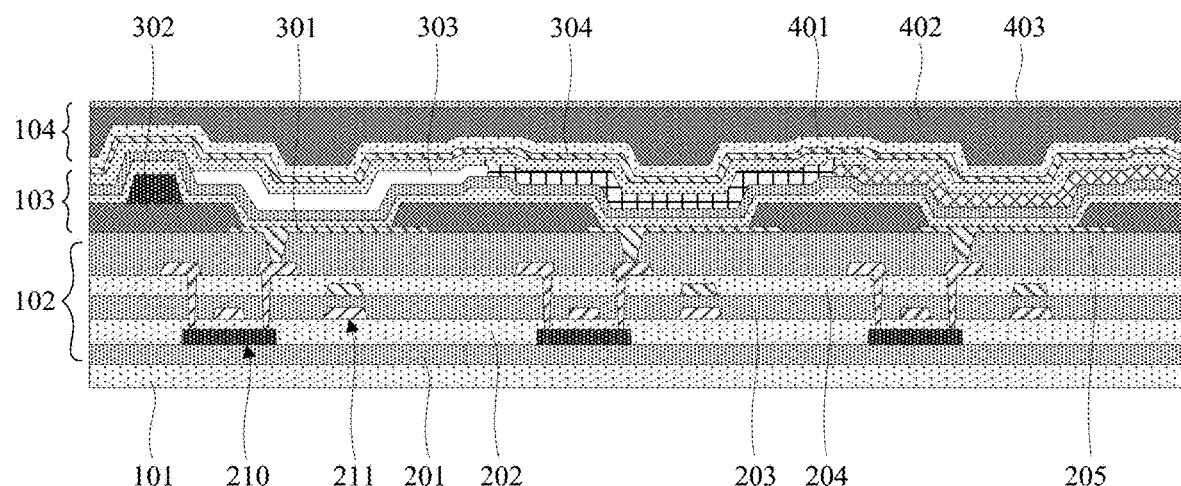
FIG. 4 is a schematic sectional view of a display substrate.

FIG. 4 is a schematic sectional view of a display substrate, showing a structure of three sub-pixels in an OLED display substrate. As shown in FIG. 4, on a plane perpendicular to the display substrate, the display substrate may include a drive circuit layer 102 disposed on a substrate 101, a light-emitting device 103 disposed on a side of the drive circuit layer 102 away from the base substrate 101, and an encapsulation layer 104 disposed on a side of the light-emitting device 103 away from the base substrate 101. In some possible implementations, the display substrate may include other film layers, such as spacer posts, etc., which is not limited in the present disclosure.

In an exemplary implementation, the substrate may be a flexible substrate or may be a rigid substrate. The flexible substrate may include a first flexible material layer, a first inorganic material layer, a semiconductor layer, a second flexible material layer and a second inorganic material layer which are stacked, wherein materials of the first flexible material layer and the second flexible material layer may be polyimide (PI), polyethylene terephthalate (PET) or a polymer soft film with surface treatment; materials of the first inorganic material layer and the second inorganic material layer may be silicon nitride (SiNx) or silicon oxide (SiOx), etc., for improving the water-resistance and oxygen-resistance of the substrate; and the material of the semiconductor layer may be amorphous silicon (a-si).

In an exemplary embodiment, the drive circuit layer 102 of each sub-pixel may include a plurality of transistors and a storage capacitor constituting a pixel drive circuit. An example in which each sub-pixel includes a drive transistor and a storage capacitor is illustrated in FIG. 3. In some possible implementations, the drive circuit layer 102 of each sub-pixel may include: a first insulating layer 201 disposed on the substrate; an active layer disposed on the first insulating layer; a second insulating layer 202 covering the active layer; a gate electrode and a first capacitor electrode disposed on the second insulating layer 202; a third insulating layer 203 covering the gate electrode and the first capacitor electrode; a second capacitor electrode disposed on the third insulating layer 203; a fourth insulating layer 204 covering the second capacitor electrode, wherein the second insulating layer 202, the third insulating layer 203 and the fourth insulating layer 204 are provided with via holes exposing the active layer; a source electrode and a drain electrode disposed on the fourth insulating layer 204, wherein the source electrode and the drain electrode are respectively connected to the active layer through via holes; and a planarization layer 205 covering the aforementioned structure, wherein the planarization layer 205 is provided with a via hole exposing the drain electrode. The active layer, the gate electrode, the source electrode and the drain electrode form a drive transistor 210. The first capacitor electrode and the second capacitor electrode form a storage capacitor 211.

In an exemplary embodiment, the light-emitting device 103 may include an anode 301, a pixel defining layer 302, an organic emitting layer 303 and a cathode 304. The anode 301 is disposed on the planarization layer 205, and is connected to the drain electrode of the drive transistor 210 through a via hole disposed on the planarization layer 205; the pixel define layer 302 is disposed on the anode 301 and the planarization layer 205, and the pixel define layer 302 is provided with a pixel opening exposing the anode 301; the organic emitting layer 303 is at least partially disposed in the pixel opening, and is connected to the anode 301; the cathode 304 is disposed on the organic emitting layer 303, and is connected to the organic emitting layer 303; and the organic emitting layer 303 emits light of corresponding colors under the drive of the anode 301 and the cathode 304.

In an exemplary embodiment, an encapsulation layer 104 may include a first encapsulation layer 401, a second encapsulation layer 402 and a third encapsulation layer 403 that are stacked; the first encapsulation layer 401 and the third encapsulation layer 403 may be made of an inorganic material, and the second encapsulation layer 402 may be made of an organic material; the second encapsulation layer 402 is disposed between the first encapsulation layer 401 and the third encapsulation layer 403 to ensure that external vapor may not enter into the emitting device 103.

In an exemplary embodiment, the organic emitting layer of the OLED emitting element may include an Emitting Layer (EML), and one or more film layers selected from a Hole Injection Layer (HIL), a Hole Transport Layer (HTL), a Hole Block Layer (HBL), an Electron Block Layer (EBL), an Electron Injection Layer (EIL) and an Electron Transport Layer (ETL). Driven by the voltage of the anode and the cathode, light is emitted using the light-emitting characteristics of the organic material according to the required gray scale.

In an exemplary embodiment, the emitting layers of OLED emitting elements of different colors are different. For example, red emitting element includes a red emitting layer, green emitting element includes a green emitting layer, and blue emitting element includes a blue emitting layer. In order to reduce the process difficulty and improve the yield, a common layer may be used for the hole injection layer and the hole transport layer on one side of the emitting layer, and a common layer may be used for the electron injection layer and the electron transport layer on the other side of the emitting layer. In an exemplary embodiment, any one or more layers of the hole injection layer, the hole transport layer, the electron injection layer and the electron transport layer may be manufactured by one-time process (one-time evaporation process or one-time ink-jet printing process), but the isolation is realized by means of the height difference of formed film layer or by means of the surface treatment. For example, any one or more layers of the hole injection layer, the hole transport layer, the electron injection layer and the electron transport layer corresponding to adjacent sub-pixels may be isolated. In an exemplary embodiment, the organic emitting layer may be formed by evaporation using a Fine Metal Mask (FMM) or an Open Mask, or by ink jet process.

With the continuous development of products, the market demands increasingly high display resolution of products, increasingly high brightness of independent sub-pixels and increasingly low power consumption of products, thus putting forward higher requirements for efficiency, brightness, voltage and service life of devices. In an OLED structure, the blue emitting element and the green emitting element has a short service life, which leads to white balance color drift after long-term use, and visually, phenomena such as turning red, green and pink may show up when a white screen is on. Although the research on new emitting layer materials may improve service lives of emitting elements, after years of development, not only the cost of an improvement of the service lives from a material aspect is getting increasingly high, but a potential promotion is getting increasingly small.

Figure 5:
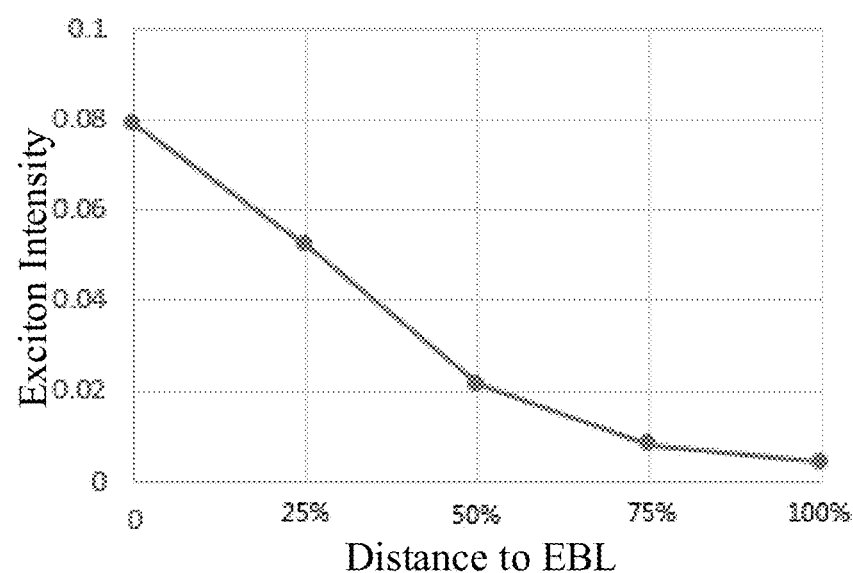
FIG. 5 is a distribution diagram of an exciton recombination region in an emitting layer.
Figure 6:
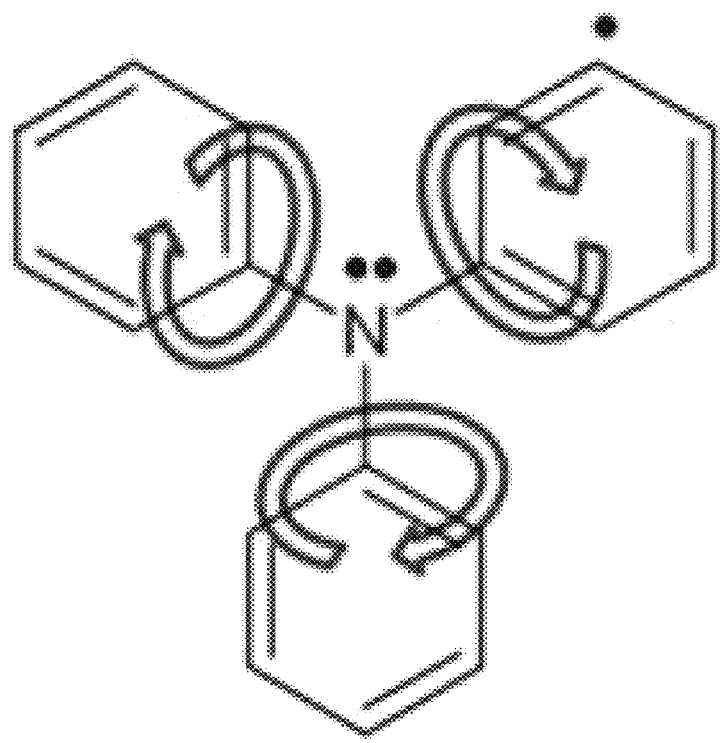
FIG. 6 is a schematic diagram of bond torsion of an electron block layer.

A research shows that the service life attenuation of monochromatic emitting elements in OLED is mainly caused by interface degradations and material defects. A main reason for the interface degradations is that energy barriers at the interface are too large and accumulated charges are a lot. For example, interfaces on both sides of the emitting layer are key interfaces where holes and electrons are injected into the emitting layer, and the energy level matching between the two interfaces may easily lead to carrier accumulation, and the charge accumulation may easily lead to an interface deterioration and accelerate life service decay of devices. A main reason for the material defects is a distortion of bonds or a fracture of bonds. For example, a material that is easy to deteriorate in an OLED is a material of an electron block layer. FIG. 5 is a distribution diagram of an exciton recombination region in an emitting layer, and FIG. 6 is a schematic diagram of bond torsion of an electron block layer. The exciton recombination region of the emitting layer is mainly concentrated at 0% of an interface between the electron block layer and the emitting layer, which makes excessive electrons accumulate at the interface, as shown in FIG. 5. Generally, a material of an electron block layer is an electron-abundance system material and contains aniline structure. Excessive accumulated electrons will have a repulsive force with abundance electrons of the electron block layer, which will cause a distortion of the δ bond of benzene rings on aniline, and a result of the distortion of the δ bond caused by the external force is bond fracture, leading to material defects and rapid service life decay of devices, as shown in FIG. 6. Further research shows that the exciton recombination region is mainly determined by transmittance of emitting host materials. By adjusting other functional layers, results of recombination region are similar to those in FIG. 5.

Figure 7:
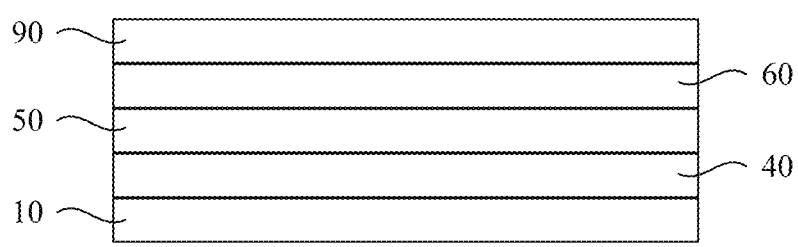
FIG. 7 is a schematic diagram of an OLED structure according to an exemplary embodiment of the present disclosure.

FIG. 7 is a schematic diagram of an OLED structure according to an exemplary embodiment of the present disclosure. As shown in FIG. 7, the OLED includes an anode 10, a cathode 90, and an organic emitting layer disposed between the anode 10 and the cathode 90. In an exemplary embodiment, the organic emitting layer may include an electron block layer 40, an emitting layer 50, and a hole block layer 60 which are stacked, wherein the electron block layer 40 is disposed between the anode 10 and the emitting layer 50, and the hole block layer 60 is disposed between the emitting layer 50 and the cathode 90. In an exemplary embodiment, the electron block layer 40 is configured to form a migration barrier for electrons and prevent electrons from migrating out of the emitting layer 50. The emitting layer 50 is configured to recombine electrons and holes to emit light. The hole block layer 60 is configured to form a migration barrier for holes and prevent holes from migrating out of the emitting layer 50.

Figure 8:
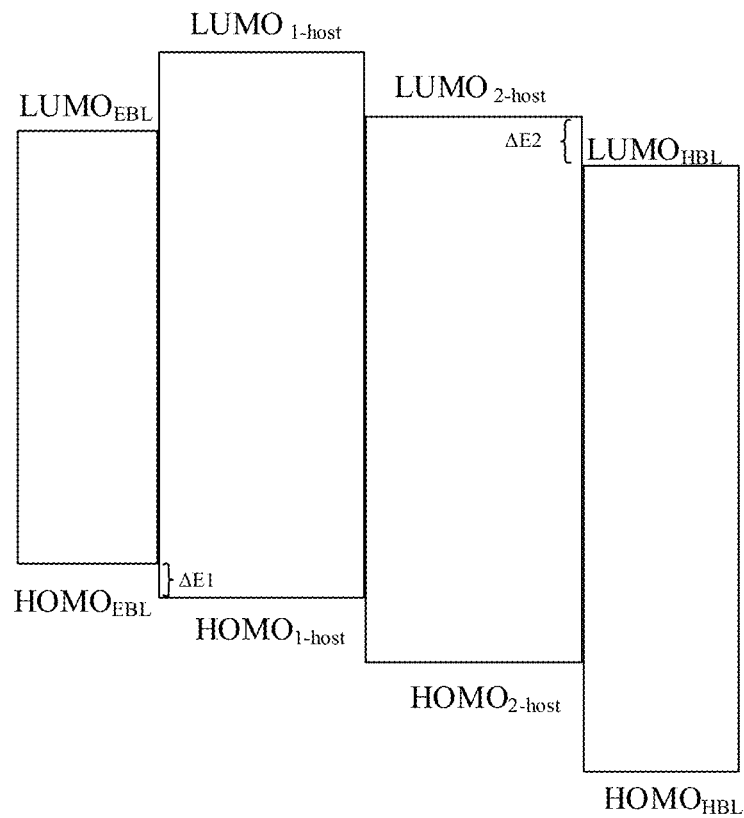
FIG. 8 is a schematic diagram of an energy level relationship of an OLED structure according to an exemplary embodiment of the present disclosure.

In an exemplary embodiment, the light emitting layer 50 includes a first host material, a second host material, and a dopant material. FIG. 8 is a schematic diagram of an energy level relationship of an OLED structure according to an exemplary embodiment of the present disclosure. In an exemplary embodiment, as shown in FIG. 8, a Highest Occupied Molecular Orbit (HOMO) energy level of an electron block layer, $HOMO_{HBL}$ is higher than a HOMO of a first host material, $HOMO_{1\text{-}host}$; the HOMO of the first host material, $HOMO_{1\text{-}host}$ is higher than a HOMO of a second host material, $HOMO_{2\text{-}host}$; the HOMO of the second host material, $HOMO_{2\text{-}host}$ is higher than a HOMO of a hole block layer, $HOMO_{HBL}$. A Lowest Unoccupied Molecular Orbital (LUMO) energy level of the electron block layer, $LUMO_{HBL}$ is higher than a LUMO of the first host material, $HOMO_{1\text{-}host}$; the LUMO of the first host material, $LUMO_{1\text{-}host}$ is higher than a LUMO of the second host material, $LUMO_{2\text{-}host}$; the LUMO of the second host material, $LUMO_{2\text{-}host}$ is higher than a LUMO of the hole block layer, $LUMO_{HBL}$.

In an exemplary embodiment, a host material of the first host material may include a p-type emitting material, and a host material of the second host material may include an n-type emitting material.

In an exemplary embodiment, a first host material, a second host material, an electron block layer, and a hole block layer may satisfy:

$|HOMO_{1\text{-}host}\text{-}HOMO_{EBL}|\leq 0.2$ eV, i.e. $\Delta E1 \leq 0.2$ eV;

$|LUMO_{HBL}\text{-}LUMO_{2\text{-}host}|\leq 0.2$ eV, i.e. $\Delta E2 \leq 0.2$ eV.

In an exemplary embodiment, by setting a HOMO energy level relationship between the electron block layer and the first host material, a hole accumulation caused by an energy level gap may be reduced; by setting a LUMO energy level relationship between the second host material and the hole block layer, an electron accumulation at an interface may be reduced; therefore, two interfaces on both sides of the emitting layer are optimized, and charge accumulation at the interfaces is reduced.

In an exemplary embodiment, a first host material and an electron block layer may satisfy:

$|LUMO_{HBL}\text{-}LUMO_{1\text{-}host}|=0.3$ eV to 0.4 eV.

In an exemplary embodiment, by setting a LUMO energy level relationship between the first host material and the electron block layer, an electron concentration may be adjusted by using the energy level of the first host material, balance of carriers in an emitting layer may be improved, and luminance efficiency of a device may be raised.

In an exemplary embodiment, a second host material and a hole block layer may satisfy:

$$|HOMO_{HBL}-HOMO_{2\text{-}host}|\geq 0.3 \text{ eV}.$$

In an exemplary embodiment, by setting a HOMO energy level relationship between the second host material and the hole block layer, it may be beneficial to block holes, limit holes in the emitting layer and increase hole concentrations inside the emitting layer, thereby improving the balance of carriers in the emitting layer, and raising the luminance efficiency of the device.

In an exemplary embodiment, a HOMO energy level of the electron block layer may be about −5.2 eV to −5.6 eV; a HOMO energy level of the first host material may be about −5.3 eV to −5.6 eV; a HOMO energy level of the second host material may be about −5.6 eV to −6.0 eV; and a HOMO energy level of the hole block layer may be about −5.8 eV to −6.5 eV.

In an exemplary embodiment, a LUMO energy level of the electron block layer may be about −2.2 eV to −2.6 eV; a LUMO energy level of the first host material may be about −2.0 eV to −2.4 eV, a LUMO energy level of the second host material may be about −2.2 eV to −2.6 eV; and a LUMO energy level of the hole block layer may be about −2.3 eV to −2.8 eV.

In an exemplary embodiment, hole mobility of an electron block layer may be greater than electron mobility of the electron block layer.

In an exemplary embodiment, the hole mobility of the electron block layer may be about $10^{-4}$ cm$^2$/Vs to $10^{-6}$ cm$^2$/Vs, and the electron mobility of the electron block layer may be less than $10^{-8}$ cm$^2$/Vs.

In an exemplary embodiment, the hole mobility of the electron block layer may be greater than 10 times hole mobility of a first host material.

In an exemplary embodiment, the hole mobility of the first host material may be about $10^{-5}$ cm$^2$/Vs to $10^{-7}$ cm$^2$/Vs.

In an exemplary embodiment, the electron mobility of the electron block layer may be greater than that of a second host material.

In an exemplary embodiment, the electron mobility of the second host material may be about $10^{-8}$ cm$^2$/Vs to $10^{-9}$ cm$^2$/Vs.

In an exemplary embodiment, electron mobility of a hole block layer may be greater than a hole mobility of the hole block layer.

In an exemplary embodiment, the electron mobility of the hole block layer may be about $10^{-7}$ cm$^2$/Vs to $10^{-9}$ cm$^2$/Vs.

In an exemplary embodiment, the emitting layer includes a host material and a dopant material doped in the host material, and a doping ratio of the dopant material of the emitting layer is 1% to 20%, and the doping ratio refers to a ratio of mass of the dopant material to mass of the emitting layer, that is, mass percentage. Within a range of the doping ratio, on the one hand, the host material of the emitting layer may effectively transfer exciton energy to the dopant material of the emitting layer to stimulate the dopant material of the emitting layer to emit light, on the other hand, the host material of the emitting layer "dilutes" the dopant material of the emitting layer, which effectively improves fluorescence quenching caused by a collision between molecules of the dopant material of the emitting layer and a collision between energies, and improves a luminance efficiency and a service life of a device. The host material includes a first host material and a second host material, that is, the host material a mixture of the first host material and the second host material. In the emitting layer host material, a mixing ratio of the first host material and the second host material may be 2:8 to 8:2.

In an exemplary embodiment, the host material and the dopant material are co-evaporated, so that the host material and the dopant material are uniformly dispersed in the hole injection layer. A mixing ratio and a doping ratio may be adjusted by controlling evaporation rates of the first host material, the second host material or the dopant material during an evaporation process.

In an exemplary embodiment, a thickness of an electron block layer 40 is about 30 nm to 50 nm.

In an exemplary embodiment, a thickness of an emitting layer 50 is about 30 nm to 50 nm.

In an exemplary embodiment, a thickness of a hole block layer 60 is about 5 nm to 15 nm.

In an exemplary embodiment, a thickness of the emitting layer 50 is different from that of the electron block layer 40. For example, a thickness of the emitting layer 50 may be greater than that of the electron block layer 40.

In an exemplary embodiment, a HOMO energy level and a LUMO energy level may be measured by photoelectron spectrophotometer (AC3/AC2) or ultraviolet (UV) spectroscopy, electron mobility may be measured by space charge limited current method (SCLC).

In an exemplary embodiment, the emitting layer is a green emitting layer. An overall performance of an organic light emitting device may be better improved by increasing a luminance efficiency and service life of the green emitting layer.

In an OLED structure, an exciton recombination region is mainly concentrated at an interface between the emitting layer and the electron block layer, which makes excessive electrons accumulate at the interface. The accumulated electrons will lead to a material cracking of the electron block layer, thus reducing stability and a service life of the material. According to the exemplary embodiment of the present disclosure, by setting an energy level relationship, mobility relationship or a relationship of an energy level and mobility between the electron block layer, the hole block layer, and the first and second host materials of the emitting layer, charge accumulation at an interface may be reduced, and a hole concentration in the emitting layer may be appropriately increased and the electron concentration in the emitting layer may be appropriately reduced, so that the exciton recombination region moves toward a center of the emitting layer and is far away from the electron block layer, thus reducing the damage to the electron block layer. In this way, the damage of the electron block layer is reduced while the accumulation of interface charges is reduced, so that the material stability of the electron block layer is improved, the material degradation and performance degradation caused by electron accumulation are reduced, the service life of the device is prolonged, and the luminance efficiency is improved.

In an exemplary embodiment, a material of the electron block layer may include, but is not limited to, compounds having structures of Formula 1:

Formula 1

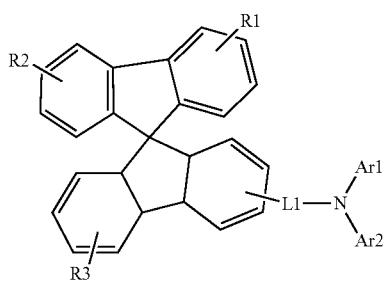

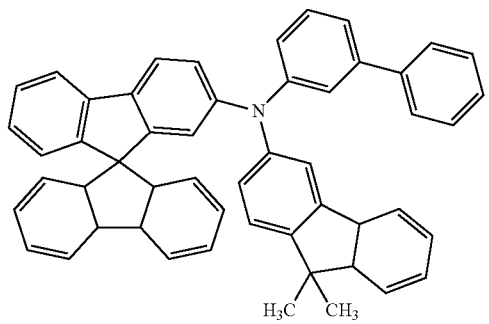
Formula 1-2

Ar1 to Ar2 are independently substituted or unsubstituted aryl group with 6-30 ring carbon atoms or substituted or unsubstituted heteroaryl group with 5-20 ring atoms, and at least one of them is methyl fluorene, dibenzofuran or thiophene. L1 is a single bond or a substituted aryl group containing 6-30 carbon atoms. R1 to R3 are independently substituted or unsubstituted alkyl or aryl with 1-30 ring carbon atoms, or substituted or unsubstituted heteroaryl with 5-20 ring atoms.

In an exemplary embodiment, the structure shown in Formula 1 contains a main core spirofluorene structure with high hole mobility, which may increase hole transport and hole concentration in the emitting layer, and is beneficial for the exciton recombination region in the emitting layer to be far away from an interface between the electron block layer and the emitting layer, making it away from the electron block layer, thus reducing the damage to the electron block layer and prolonging the service life. In addition, a spirofluorene is a sp3 hybrid orthogonal structure, difficult to crystallize with good stability, and is a stable electron block layer with high mobility.

In an exemplary embodiment, an electron block layer may include, but is not limited to, compounds having structures shown in Formula 1-1 to Formula 1-6:

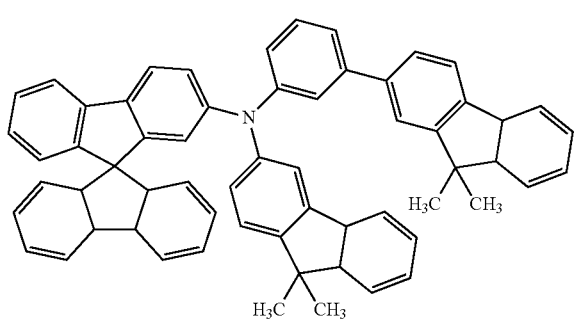
Formula 1-3

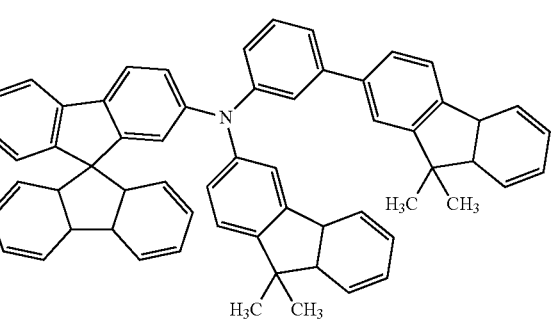
Formula 1-4

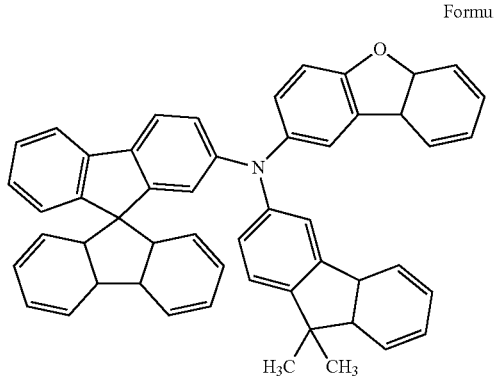
Formula 1-1

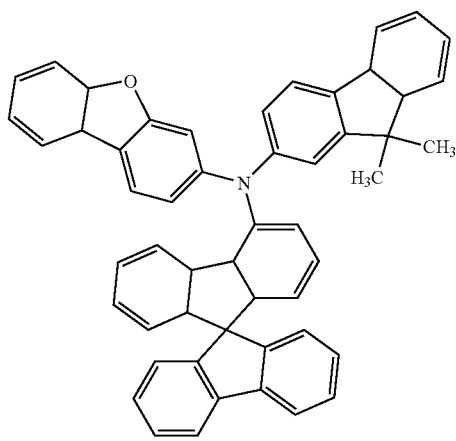
Formula 1-5

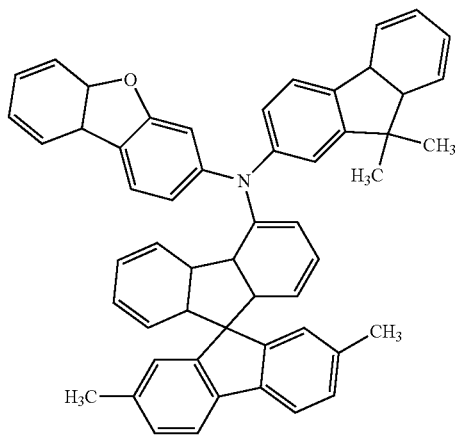

Formula 1-6

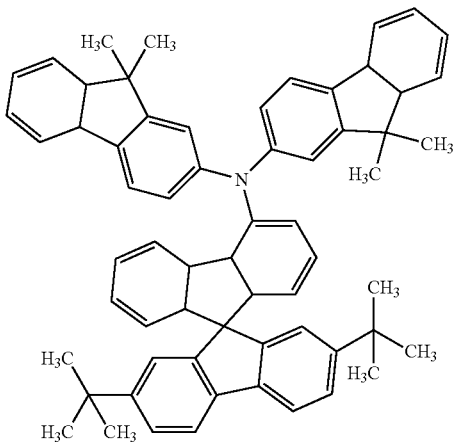

Formula 2-1

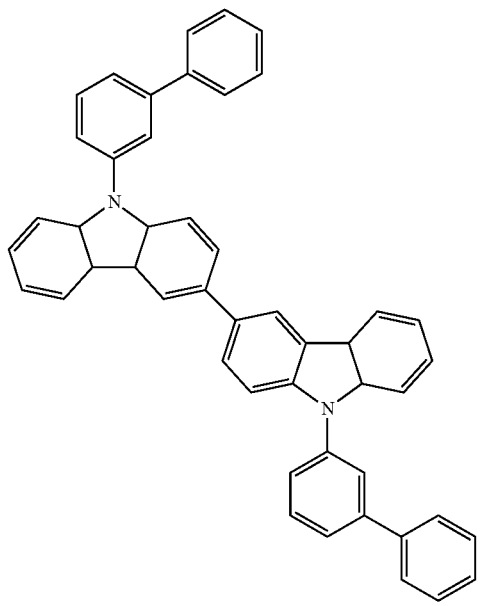

In an exemplary embodiment, a first host material may include, but is not limited to, a compound having a structure shown in Formula 2:

Formula 2

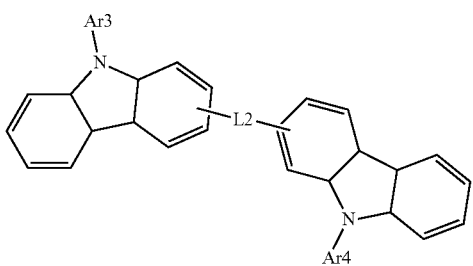

Wherein Ar3 to Ar4 are independently substituted or unsubstituted C6-C30 aryl, substituted or unsubstituted heteroaryl, and aryl or heteroaryl containing silicon, cyano, halogen or deuterium. L2 is a single bond or a substituted or unsubstituted aryl group containing 6-30 carbon atoms.

In an exemplary embodiment, a core host of a structure shown in Formula 2 includes a biscarbazole structure with very high lowest triplet energy T1, which is conducive to energy transmission from a host to a dopant, while preventing the return of triplet excitons, increasing concentrations of effective emitting excitons and improving the efficiency. In addition, the structure shown in Formula 2 has high hole mobility.

In an exemplary embodiment, a first host material may include, but is not limited to, compounds having structures shown in Formula 2-1 to Formula 2-6:

Formula 2-2

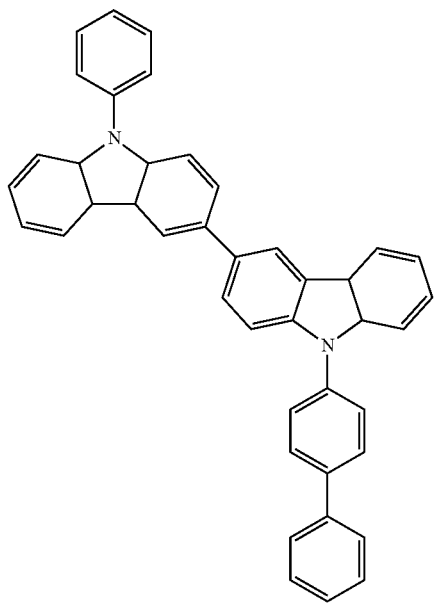

Formula 2-3
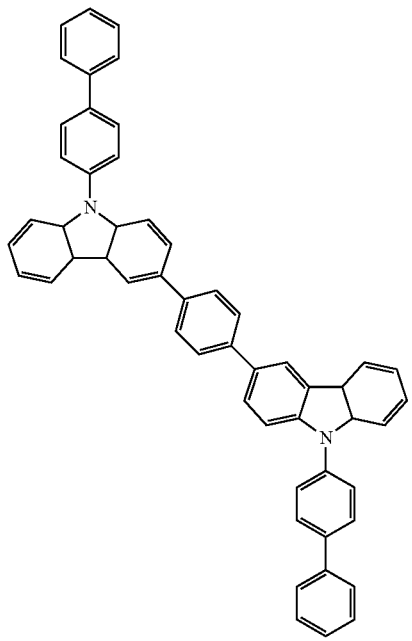
Formula 2-5
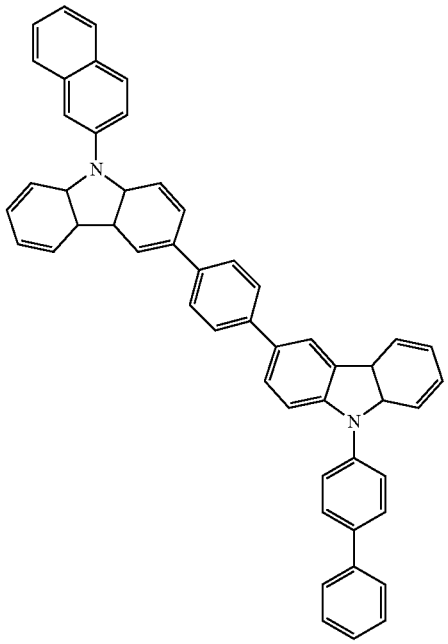
Formula 2-4
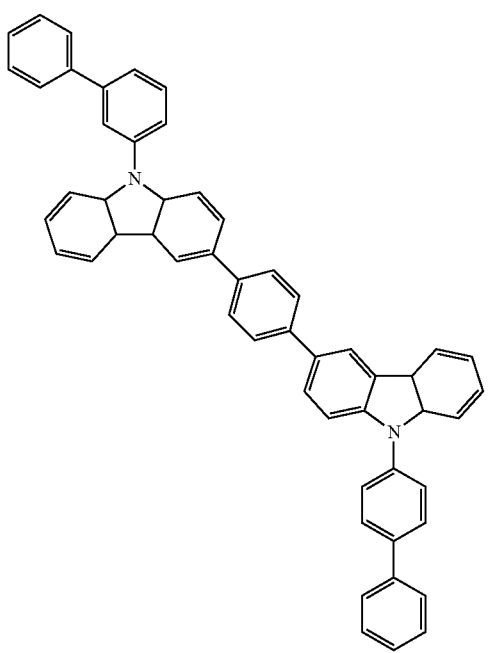
Formula 2-6
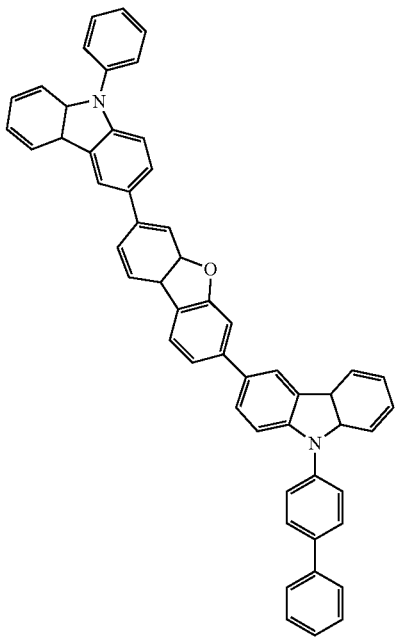
In an exemplary embodiment, a second host material may include, but is not limited to, a compound having a structure shown in Formula 3:

Formula 3

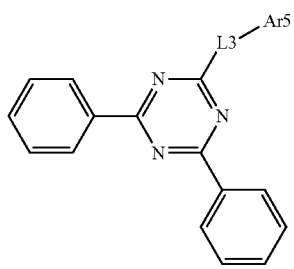

Ar5 is substituted or unsubstituted aryl or heteroaryl with 6-30 carbon atoms, or contains carbazole, dibenzofuran and thiophene. L3 is aryl with 6-20 carbon atoms.

In an exemplary embodiment, a material with a structure shown in Formula 3 not only has electron transport characteristics, but also may increase the lowest triplet energy T1 of the second host material by introducing substituent groups.

In an exemplary embodiment, a second host material may include, but is not limited to, compounds having structures shown in Formula 3-1 to Formula 3-5:

Formula 3-1

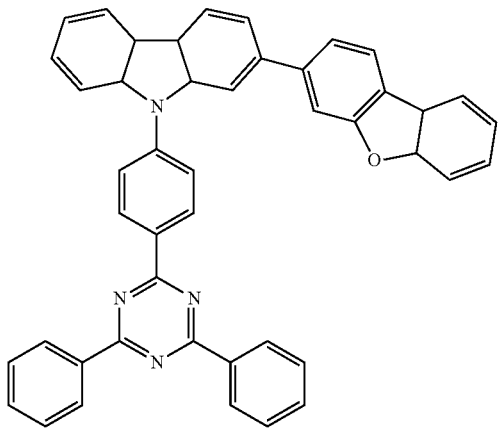

Formula 3-2

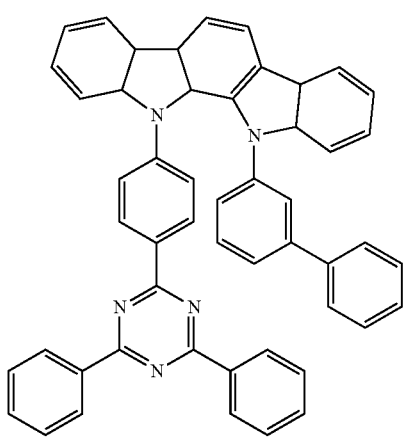

Formula 3-3

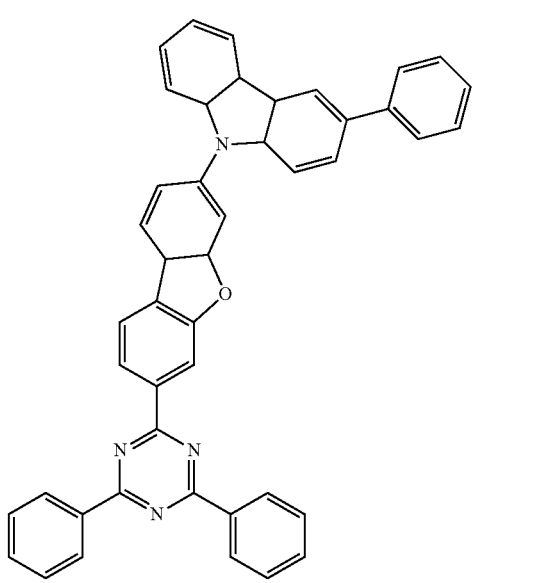

Formula 3-4

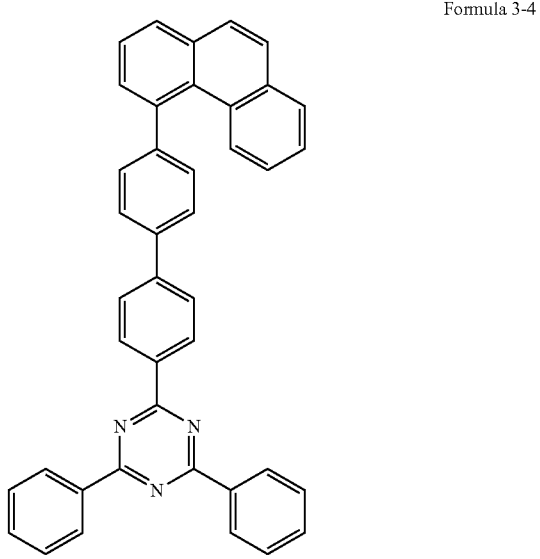

Formula 3-5

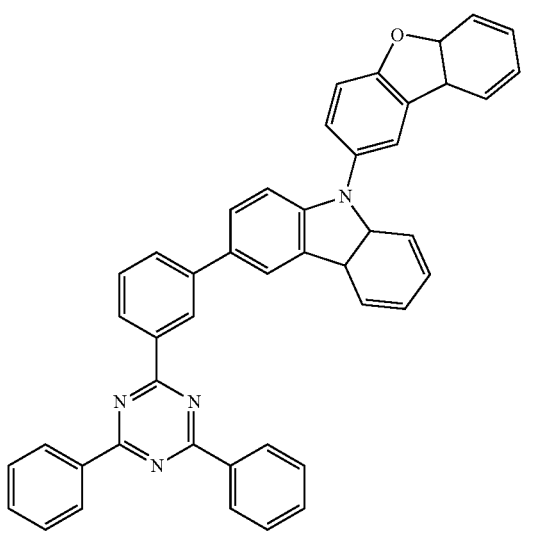

In an exemplary embodiment, an emitting layer including a first host material and a second host material has a very high minimum triplet energy T1, and when combined with an electron block layer with high hole mobility, an effective triplet exciton probability and an effective emission exciton concentration may be increased, and the efficiency may be improved.

In an exemplary embodiment, a first host material, a second host material, an electron block layer and a hole block layer may be other materials known to those skilled in the art that satisfy the above-mentioned energy level relationships, which is not limited hereto in the present disclosure.

Figure 9:
FIG. 9 is a schematic diagram of another OLED structure according to an exemplary embodiment of the present disclosure.

FIG. 9 is a schematic diagram of another OLED structure according to an exemplary embodiment of the present disclosure. As shown in FIG. 9, the OLED includes an anode 10, a cathode 90, and an organic emitting layer disposed between the anode 10 and the cathode 90. In an exemplary embodiment, the organic emitting layer may include a hole injection layer 20, a hole transport layer 30, an electron block layer 40, an emitting layer 50, a hole block layer 60, an electron transport layer 70, and an electron injection layer 80 which are stacked. The hole injection layer 20, the hole transport layer 30 and the electron block layer 40 are disposed between the anode 10 and the emitting layer 50; the hole injection layer 20 is connected to the anode 10, and the electron block layer 40 is connected to the emitting layer 50; the hole transport layer 30 is disposed between the hole injection layer 20 and the electron block layer 40. The hole block layer 60, the electron transport layer 70 and the electron injection layer 80 are disposed between the emitting layer 50 and the cathode 90; the hole block layer 60 is connected to the emitting layer 50; the electron injection layer 80 is connected to the cathode 90; and the electron transport layer 70 is disposed between the hole block layer 60 and the electron injection layer 80. In an exemplary embodiment, the hole injection layer 20 is configured to lower a barrier for injecting holes from the anode, so that the holes may be efficiently injected into the emitting layer 50 from the anode. The hole transport layer 30 is configured to realize directional and orderly controlled migration of injected holes. The electron block layer 40 is configured to form a migration barrier for electrons and prevent electrons from migrating out of the emitting layer 50. The emitting layer 50 is configured to recombine electrons and holes to emit light. The hole block layer 60 is configured to form a migration barrier for holes and prevent holes from migrating out of the emitting layer 50. The electron transport layer 70 is configured to realize directional and orderly controlled migration of injected electrons. The electron injection layer 80 is configured to lower barriers of electrons injected from the cathode, so that the electrons may be efficiently injected into the emitting layer 50 from the cathode.

In an exemplary embodiment, the emitting layer 50 includes a first host material, a second host material and a dopant material, and the materials and structures of the electron block layer 40, the first host material and the second host material are the same as or similar to those of the previous embodiments, which will not be repeatedly described here.

In an exemplary embodiment, the anode may be made of a material having a high work function. For the bottom emission type, the anode may be made of a transparent oxide material, such as indium tin oxide (ITO) or indium zinc oxide (IZO), and the thickness of the anode may be about 80 nm to 200 nm. For the top emitting type, the anode may be made of a composite structure of metal and transparent oxide, such as Ag/ITO, Ag/IZO or ITO/Ag/ITO. The thickness of the metal layer in the anode may be about 80 nm to 100 nm, and the thickness of the transparent oxide in the anode may be about 5 nm to 20 nm, so that the average reflectivity of the anode in the visible region is about 85%~95%.

In an exemplary embodiment, for a top emitting OLED, the cathode may be formed by an evaporation process using a metal material. The metal material may be magnesium (Mg), silver (Ag) or aluminum (Al), or alloy material such as Mg:Ag alloy, with a ratio of Mg:Ag being about 9:1 to 1:9. A thickness of the cathode may be about 10 nm to 20 nm so that average transmittance of the cathode at a wavelength of 530 nm is about 50%~60%. For the bottom emission OLED, the cathode may be made of magnesium (Mg), silver (Ag), aluminum (Al) or Mg:Ag alloy. The thickness of the cathode may be greater than about 80 nm, so that the cathode has good reflectivity.

In an exemplary embodiment, the hole injection layer may adopt inorganic oxides, such as molybdenum oxide, titanium oxide, vanadium oxide, rhenium oxide, ruthenium oxide, chromium oxide, zirconium oxide, hafnium oxide, tantalum oxide, silver oxide, tungsten oxide or manganese oxide, or may adopt P-type dopants with strong electron-withdrawing systems and dopants of hole transport materials, such as hexacyanohexaazatriphenylene, 2,3,5,6-Tetrafluoro-7,7',8,8'-tetracyanoquinodimethane (F4-TCNQ) or 1,2,3-tri[(cyano)(4-cyano-2,3,5,6-tetrafluorophenyl)methylene]cyclopropane, etc.

In an exemplary embodiment, a thickness of the hole injection layer may be about 5 nm to 20 nm.

In an exemplary embodiment, the hole transport layer may adopt aromatic amines or carbazole materials with hole transport characteristics, such as 4,4'-bis[N-(1-naphthyl)-N-phenylamino]biphenyl (NPB), N,N'-bis(3-methylphenyl)-N,N'-diphenyl-[1,1 4'-diamine (TPD), 4-phenyl-4'-(9-phenylfluorene-9-yl)triphenylamine (BAFLP), 4,4'-bis[N-(9,9-dimethylfluorene-2-yl)-N-phenylamino]biphenyl (DFLDPBi), 4,4'-bis(9-carbazolyl)biphenyl (CBP) or 9-phenyl-3-[4-(10-phenyl-9-anthryl)phenyl]-9H-carbazole (PCzPA), etc.

In an exemplary embodiment, a thickness of the hole transport layer may be about 80 nm to 120 nm, and conductivity of the hole transport layer is less than or equal to conductivity of the hole injection layer.

In an exemplary embodiment, the electron transport layer and the hole block layer may use aromatic heterocyclic compounds, such as imidazole derivatives like benzimidazole derivatives, imidazopyridine derivatives, and benzimidazophenanthridine derivatives; oxazine derivatives like pyrimidine derivatives and triazine derivatives; quinoline derivatives, isoquinoline derivatives, phenanthroline derivatives, compounds having a nitrogen-containing six-membered ring structure (including compounds having a phosphine oxide-based substituent on the heterocyclic ring), etc. For example, 2-(4-biphenyl)-5-(4-tert-butylphenyl)-1,3,4-oxadiazole (PBD), 1,3-bis[5-(p-tert-butylphenyl)-1,3,4-oxadiazol-2-yl]benzene (OXD-7), 3-(4-tert-butylphenyl)-4-phenyl-5-(4-biphenyl)-1,2,4-Triazole (TAZ), 3-(4-tert-butylphenyl)-4-(4-ethylphenyl)-5-(4-biphenyl)-1,2,4-triazole (p-EtTAZ), bathophenanthroline (BPhen), bathocuproine (BCP) or 4,4'-bis(5-methylbenzoxazol-2-yl) stilbene (BzOs), etc.

In an exemplary embodiment, a thickness of the hole block layer may be about 5 nm to 15 nm, and a thickness of the electron transport layer may be about 20 nm to 50 nm.

In an exemplary embodiment, the electron injection layer may use alkali metals or metals such as lithium fluoride (LiF), ytterbium (Yb), magnesium (Mg) or Calcium (ca), or compounds of these alkali metals or metals.

In an exemplary embodiment, a thickness of the electron injection layer may be about 0.5 nm to 2 nm.

In an exemplary embodiment, the OLED may include an encapsulation layer, which may be encapsulated by a cover plate, or a thin film.

In an exemplary embodiment, for a top emitting OLED, a thickness of an organic emitting layer between the cathode and the anode may be designed to meet optical path requirements of the optical microresonator, so as to obtain an optimal intensity and a color of an emitted light.

In an exemplary embodiment, the following preparation method may be used to prepare a display substrate including an OLED structure. First, a drive circuit layer is formed on a substrate through a patterning process, and a drive circuit layer of each sub-pixel may include a drive transistor and a storage capacitor constituting a pixel drive circuit. Then, a planarization layer is formed on the substrate on which the aforementioned structure is formed, and a via hole exposing a drain electrode of the drive transistor is formed on a planarization layer of each sub-pixel. An anode is formed by a patterning process on the substrate on which the aforementioned structure is formed, and an anode of each sub-pixel is connected to the drain electrode of the drive transistor through the via hole on the planarization layer. Subsequently, a pixel define layer is formed by a patterning process on the substrate on which the aforementioned structure is formed, a pixel opening exposing the anode is formed on the pixel define layer of each sub-pixel, and each pixel opening serves as an emitting region of each sub-pixel. On the substrate on which the aforementioned structure is formed, an open mask is used to evaporate a hole injection layer and a hole transport layer in sequence to form a common layer of the hole injection layer and the hole transport layer on the display substrate. That is, hole injection layers of all sub-pixels are communicated and hole transport layers of all sub-pixels are communicated. For example, areas of the hole injection layer and the hole transport layer are approximately the same, but thicknesses are different. Subsequently, a fine metal mask is used to evaporate the electron block layer and a red emitting layer, the electron block layer and a green emitting layer, and the electron block layer and a blue emitting layer in different sub-pixels, and electron block layers and emitting layers of adjacent sub-pixels may overlap in a small portion (for example, an overlap portion accounts for less than 10% of an area of a pattern of a respective emitting layer), or may be isolated. Then, an open mask is used to evaporate the hole block layer, the electron transport layer, the electron injection layer and the cathode in sequence to form a common layer of the hole block layer, the electron transport layer, the electron injection layer and the cathode on the display substrate. That is, hole block layers of all sub-pixels are communicated, electron transport layers of all sub-pixels are communicated, and cathodes of all sub-pixels are communicated.

In an exemplary embodiment, when forming an emitting layer, the host material and the dopant material are co-evaporated, so that the host material and the dopant material are uniformly dispersed in the hole injection layer. A mixing ratio and a doping ratio may be adjusted by controlling evaporation rates of the first host material, the second host material or the dopant material during an evaporation process.

In an exemplary embodiment, orthographic projections of one or more of the hole injection layer, the hole transport layer, the hole block layer, the electron transport layer, the electron injection layer, and the cathode on the base substrate is continuous. In some examples, the hole injection layer, the hole transport layer, the hole block layer, the electron transport layer, and the electron injection layer of at least one row or column of sub-pixels are communicated to at least one layer in the cathode. In some examples, a hole injection layer, a hole transport layer, a hole block layer, an electron transport layer, and an electron injection layer of a plurality of sub-pixels are communicated to at least one layer in the cathode.

In an exemplary embodiment, the organic emitting layer may include a microcavity adjusting layer located between the hole transport layer and the emitting layer. For example, after the hole transport layer is formed, a fine metal mask may be used to evaporate a red microcavity adjusting layer and the red emitting layer, a green microcavity adjusting layer and the green emitting layer, and a blue microcavity adjusting layer and the blue emitting layer in different sub-pixels. In an exemplary embodiment, the red microcavity adjusting layer, the green microcavity adjusting layer and the blue microcavity adjusting layer may include an electron block layer.

In an exemplary embodiment, since the hole block layer is a common layer and an emitting layers of different sub-pixels are isolated, an orthographic projection of the hole block layer on the substrate includes an orthographic projection of the emitting layer on the substrate, and an area of the hole block layer is larger than that of the emitting layer.

In an exemplary embodiment, since the hole block layer is a common layer, an orthographic projection of the hole block layer on the substrate at least includes orthographic projections of emitting regions of two sub-pixels on the substrate.

In an exemplary embodiment, an orthographic projection of at least part of emitting layers of sub-pixels on the substrate overlaps an orthographic projection of a drive transistor of a pixel drive circuit on the substrate.

Table 1 to Table 3 are performance comparison results of several film material combination structures according to an exemplary embodiment of the present disclosure. In a comparative experiment, structures of organic emitting layers of comparative structures and structures 1 to 8 are all HIL/HTL/EBL/EML/HBL/ETL/EIL, with a same thickness. Materials of a hole injection layer HIL, a hole transport layer HTL, a hole block layer HBL, an electron transport layer ETL and a hole injection layer EIL are the same. LT95 in the Table indicates the time for OLED to decrease from initial brightness (100%) to 95%. Since the life curve follows the multi-exponential decay model, the life of OLED may be estimated according to LT95.

Related materials of films with the same material in the comparative structure and the structure 1 to the structure 8 are as follows:

| Project | Material |
| --- | --- |
| Hole Injection Layer HIL | |
| Hole Transport Layer HTL | |
| Hole block Layer HBL | |
| ElectronTransport Layer ETL | |
| Hole Injection Layer EIL | Metal |

Table 1 is performance comparison results of different EBL materials in an exemplary embodiment of the present disclosure. In the comparative experiment, the materials of the first host material EML1 and the second host material EML2 of the comparative structures and the structures 1 to 2 are the same, but the materials of the electron block layer EBL are different. The materials of the electron block layer EBL, the first host material EML1 and the second host material EML2 of the comparative structure and the structures 1 to 2 are as follows:

Material of EBL

Comparative Structure

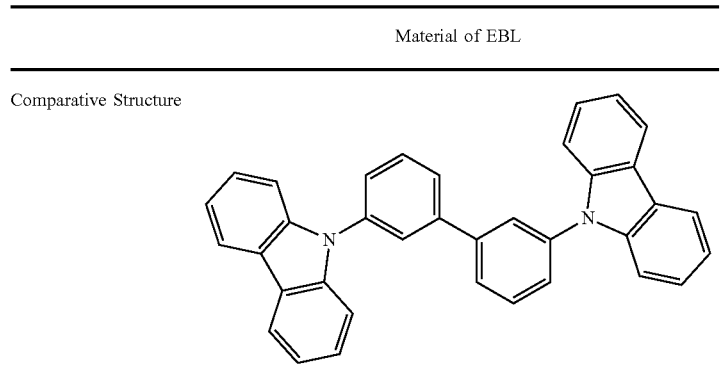

Structure 1

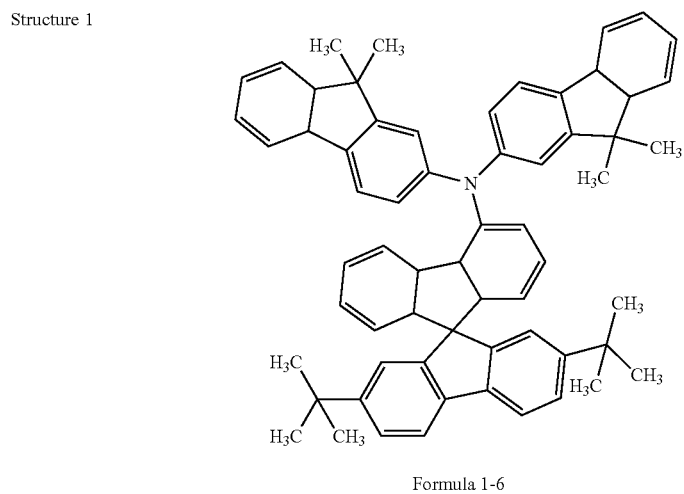

Formula 1-6

Structure 2

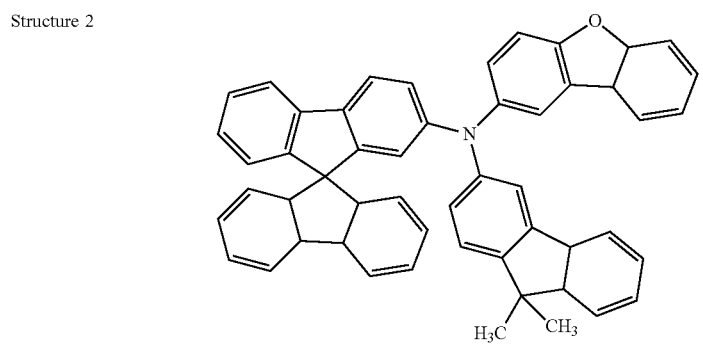

Formula 1-1

| Material of EML1 |
|---|
| Comparative Structure
Structure 1
Structure 2 |

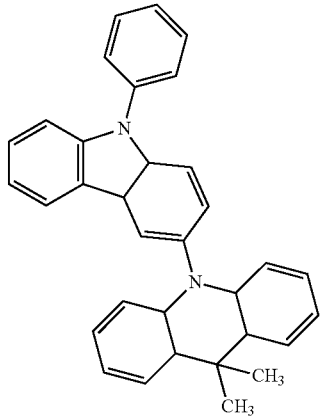 [SMILES: CC1(C)C2C=CC=CC2N(C2=CC3c4ccccc4N(c4ccccc4)C3C=C2)C2C=CC=CC21]

| Material of EML2 |
|---|
| Comparative Structure
Structure 1
Structure 2 |

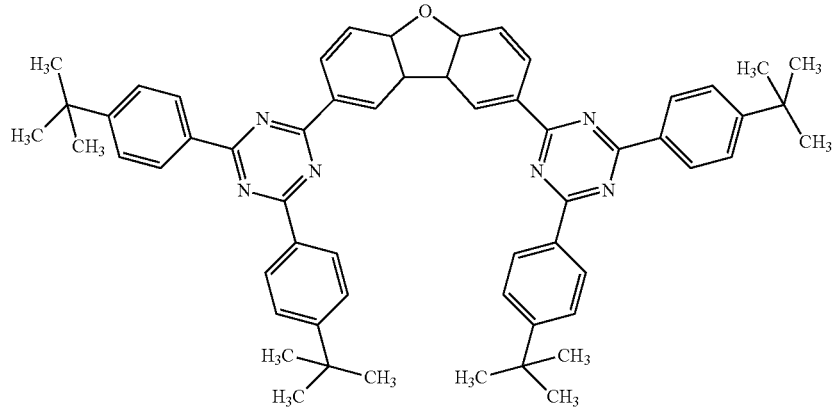 [SMILES: CC(C)(C)c1ccc(-c2nc(C3=CC4C(C=C3)OC3C=CC(c5nc(-c6ccc(C(C)(C)C)cc6)nc(-c6ccc(C(C)(C)C)cc6)n5)=CC34)nc(-c3ccc(C(C)(C)C)cc3)n2)cc1]

TABLE 1

Performance comparison results of different EBL materials

| | Voltage | Efficiency | Service Life (LT95@10000 nit) |
|---|---|---|---|
| Comparative Structure | 100% | 100% | 100% |
| Structure 1 | 100% | 102% | 120% |
| Structure 2 | 98% | 105% | 129% |

As shown in Table 1, compared with the comparative structure, both the structure 1 and the structure 2 have a significant improvement in service life. Therefore, the exemplary embodiment of the present disclosure adopts an energy level collocation of the emitting layer and the electron block layer and a combination of different electron block layer materials, so that the service life and efficiency are greatly improved.

Table 2 is performance comparison results of different materials of EML1 and EML2 in an exemplary embodiment of the present disclosure. In the comparative experiment, materials of the electron block layer EBL of the comparative structure and the structures 3 to 5 are the same, but materials of the first host material EML1 and the second host material EML2 are different. The materials of the electron block layer EBL, the first host material EML1 and the second host material EML2 of the comparative structure and the structures 1 to 2 are as follows:

| Material of EBL |
|---|
| Comparative Structure
Structure 3
Structure 4
Structure 5 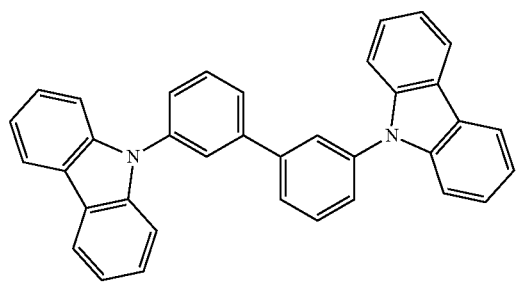 [SMILES: c1cc(-c2cccc(-n3c4ccccc4c4ccccc43)c2)cc(-n2c3ccccc3c3ccccc32)c1] |
| Material of EML1 |
|---|
| Comparative Structure 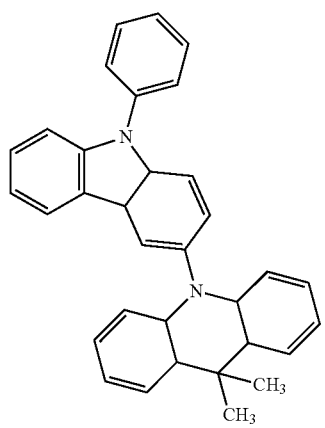 [SMILES: CC1(C)C2C=CC=CC2N(C2=CC3c4ccccc4N(c4ccccc4)C3C=C2)C2C=CC=CC21] |
| Structure 3 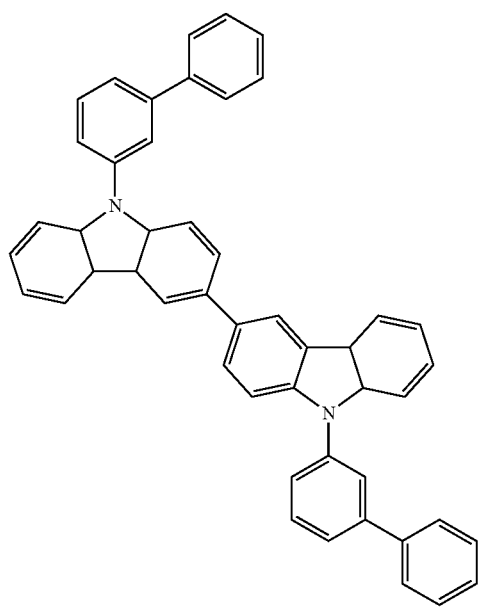
Formula 2-1 |

| Material of EML1 |
|---|
Structure 4
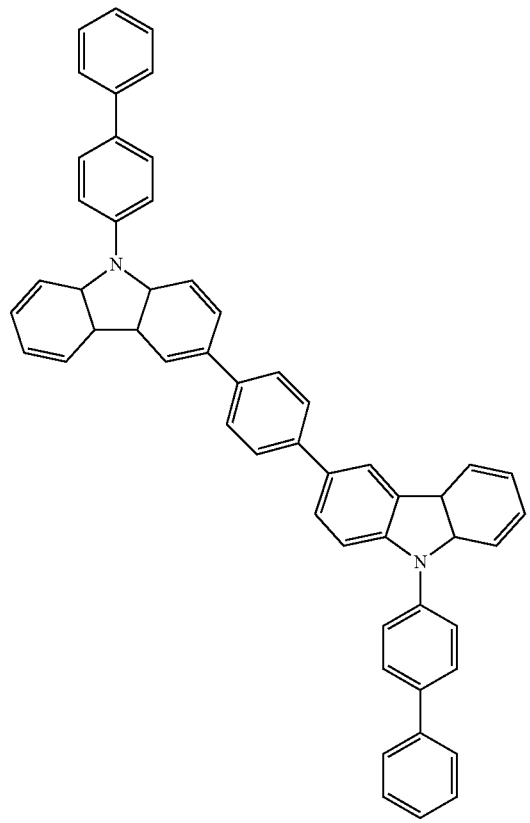
Formula 2-3
Structure 5
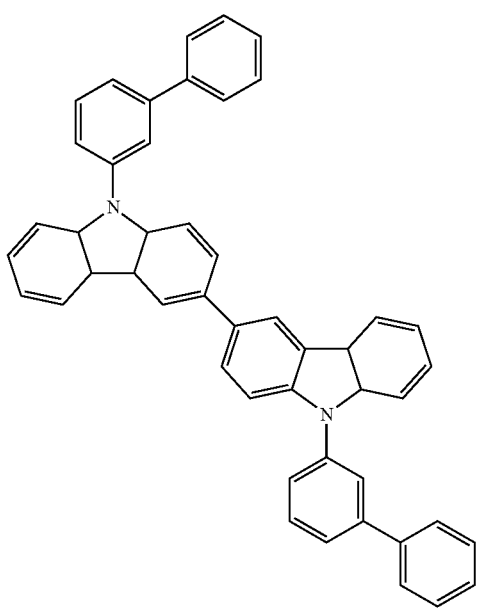
Formula 2-1

| Material of EML2 |
|---|
Comparative Structure
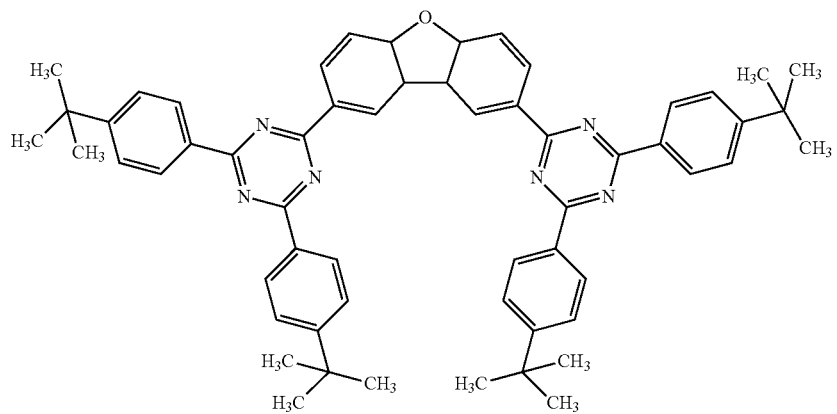 [SMILES: CC(C)(C)c1ccc(-c2nc(C3=CC4C(C=C3)OC3C=CC(c5nc(-c6ccc(C(C)(C)C)cc6)nc(-c6ccc(C(C)(C)C)cc6)n5)=CC34)nc(-c3ccc(C(C)(C)C)cc3)n2)cc1]
Structure 3
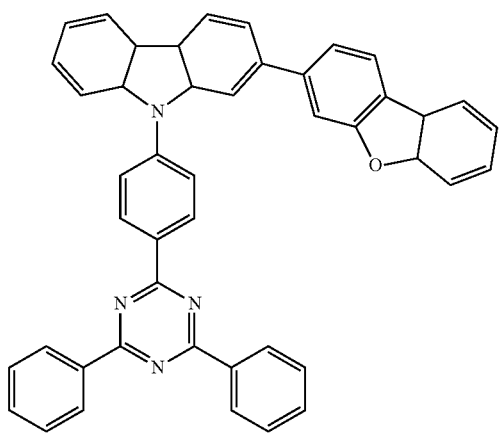
Formula 3-1
Structure 4
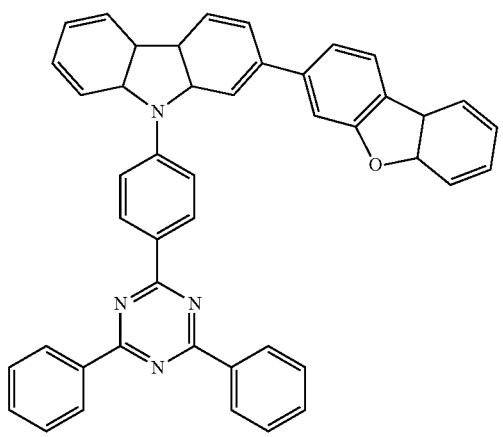
Formula 3-1

-continued

| | Material of EML2 |
|---|---|
| Structure 5 | 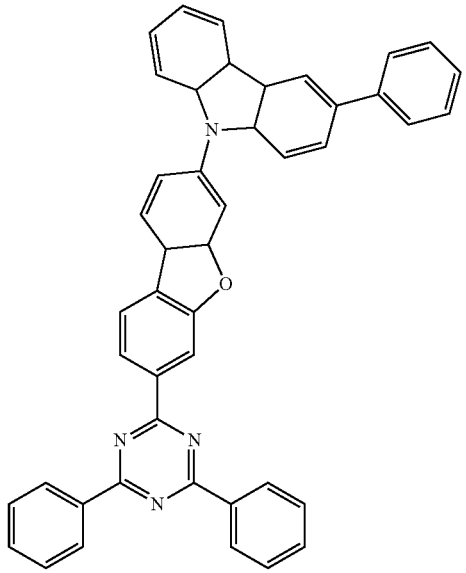<br>Formula 3-3 |

TABLE 2

Performance comparison results of different materials of EML1 and EML2

| | Voltage | Efficiency | Service Life (LT95@10000 nit) |
|---|---|---|---|
| Comparative Structure | 100% | 100% | 100% |
| Structure 3 | 98% | 113% | 113% |
| Structure 4 | 97% | 119% | 114% |
| Structure 5 | 95% | 115% | 103% |

As shown in Table 2, compared with the comparative structure, structure 3 and structure 4 have a significant improvement in efficiency and service life, while structure 5 has a significant improvement in raising efficiency and reducing voltage. Therefore, the exemplary embodiment of the present disclosure adopts an energy level collocation of the emitting layer and the electron block layer and different combinations of the first host material and the second host material, so that the service life and efficiency are greatly improved.

Table 3 shows performance comparison results of different EBL, EML1 and EML2 materials in an exemplary embodiment of the present disclosure. In the comparative experiment, materials of the electron block layer EBL, the first host material EML1 and the second host material EML2 of the comparative structure and the structures 6 to 8 are all different. The materials of the electron block layer EBL, the first host material EML1 and the second host material EML2 of the comparative structure and the structures 6 to 8 are as follows:

| | Material of EBL |
|---|---|
| Comparative Structure | 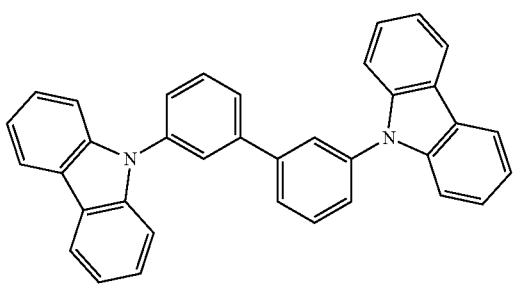 [SMILES: c1cc(-c2cccc(-n3c4ccccc4c4ccccc43)c2)cc(-n2c3ccccc3c3ccccc32)c1] |

| Material of EBL |
|---|
| Structure 6 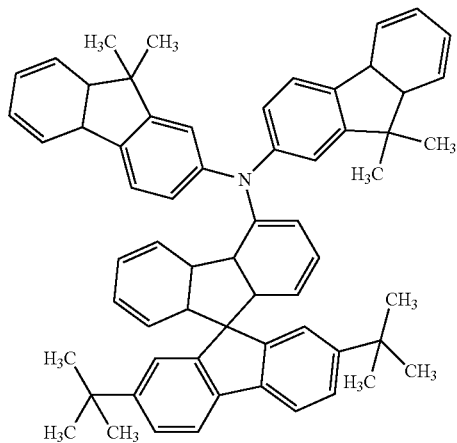<br>Formula 1-6 |
| Structure 7 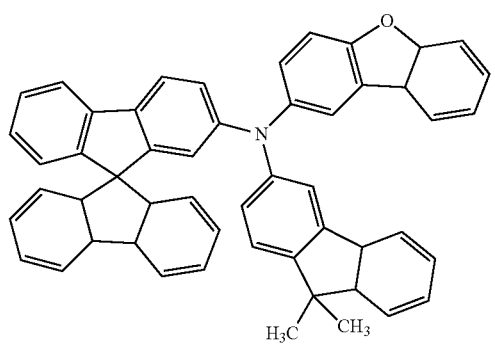<br>Formula 1-1 |
| Structure 8 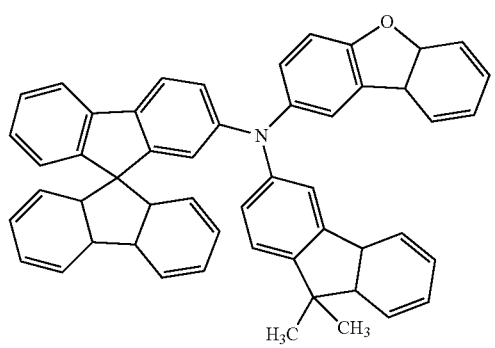<br>Formula 1-1 |

| Material of EML1 |
|---|
| Comparative Structure 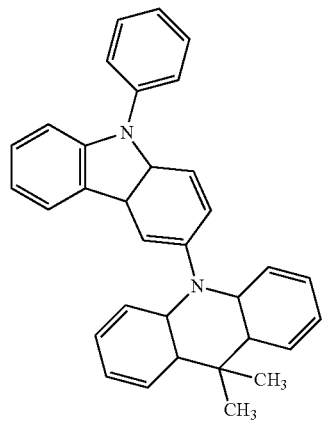 [SMILES: CC1(C)C2C=CC=CC2N(C2=CC3c4ccccc4N(c4ccccc4)C3C=C2)C2C=CC=CC21] |
| Structure 6 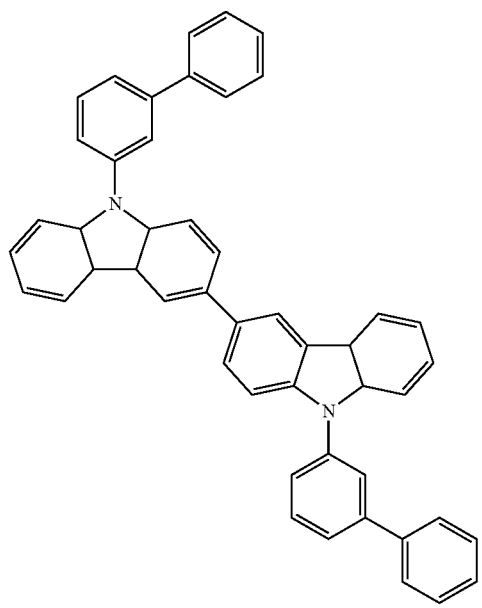
Formula 2-1 |

| Material of EML1 |
|---|
| Structure 7 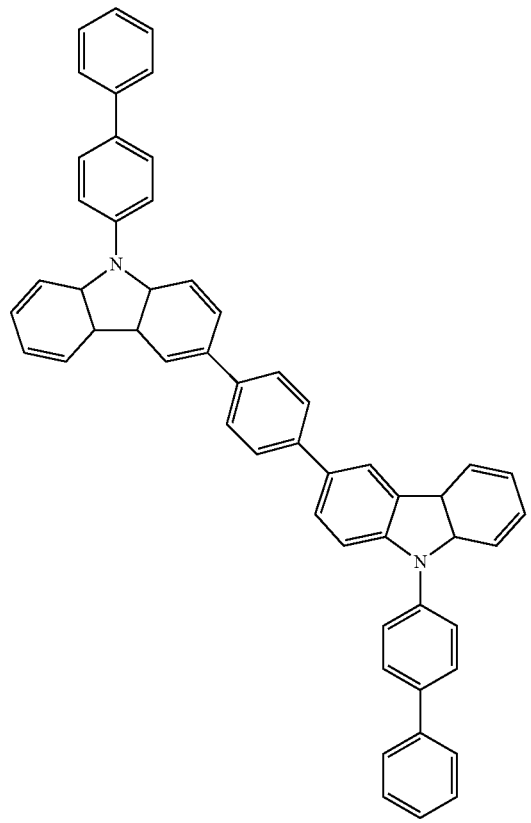<br>Formula 2-3 |
| Structure 8 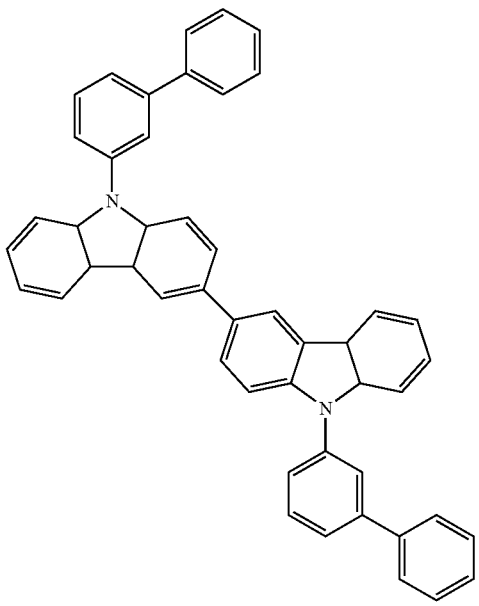<br>Formula 2-1 |

| Material of EML2 |
|---|
| Comparative Structure 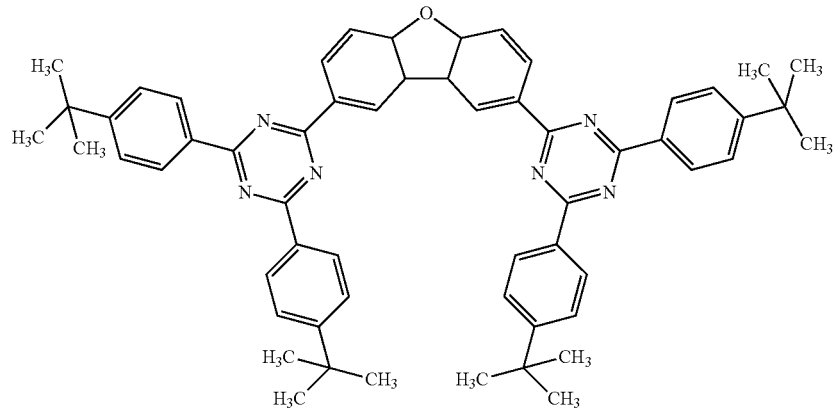 [SMILES: CC(C)(C)c1ccc(-c2nc(C3=CC4C(C=C3)OC3C=CC(c5nc(-c6ccc(C(C)(C)C)cc6)nc(-c6ccc(C(C)(C)C)cc6)n5)=CC34)nc(-c3ccc(C(C)(C)C)cc3)n2)cc1] |
| Structure 6 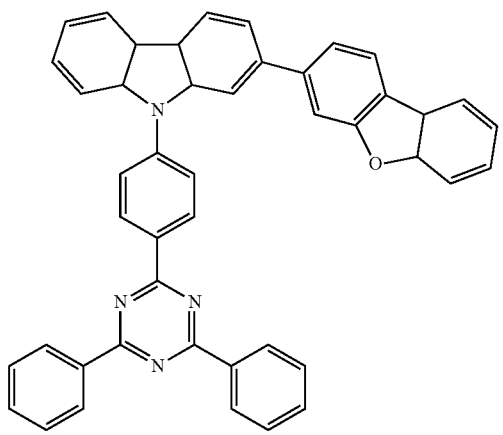
Formula 3-1 |
| Structure 7 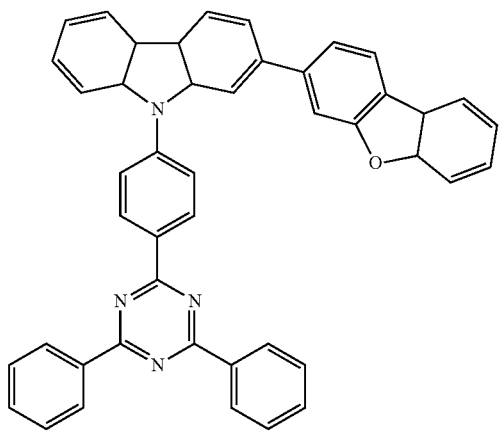
Formula 3-1 |

-continued

Material of EML2

Structure 8

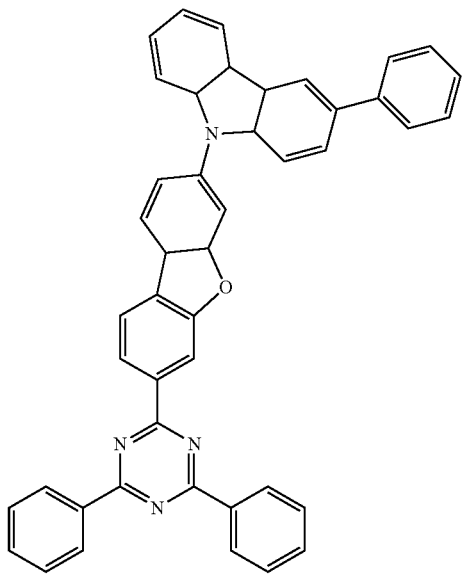

Formula 3-3

TABLE 3

Performance comparison results of different materials of EBL, EML1 and EML2

|  | Voltage | Efficiency | Service Life (LT95@10000 nit) |
|---|---|---|---|
| Comparative Structure | 100% | 100% | 100% |
| Structure 6 | 98% | 122% | 130% |
| Structure 7 | 94% | 127% | 138% |
| Structure 8 | 93% | 120% | 111% |

As shown in Table 3, compared with the comparative structure, the structures 6, 7 and 8 have a significant improvement in efficiency; the structures 6 and 7 have a significant improvement in prolonging life; and the structures 7 and 8 have a significant improvement in reducing voltage. Therefore, the exemplary embodiment of the present disclosure adopts an energy level collocation of the emitting layer and the electron block layer and different combinations of the electron block layer (material), the first host material and the second host material at the same time, so that the service life and the efficiency are greatly improved.

According to the exemplary embodiment of the present disclosure by reasonably matching the host material of the emitting layer, the dopant material of the emitting layer, and the electron block layer material, and setting an energy level relationship, mobility relationship or a relationship of an energy level and mobility between the electron block layer, the hole block layer, and the first and second host materials, two interfaces on both sides of the emitting layer are optimized to reduce accumulation of holes caused by the energy level gap, and reduce accumulation of electrons at the interface between the light-emitting layer and the electron blocking layer, and appropriately increase hole concentration and reduce electron concentration in the light-emitting layer, so that the exciton recombination region moves to a center of a emitting layer, making it away from the electron block layer, thereby reduces the damage to the electron block layer. In this way, the damage of the electron block layer is reduced while the accumulation of interface charges is reduced, so that the material stability of the electron block layer is improved, the material degradation and performance degradation caused by electron accumulation are reduced, the service life of the device is prolonged, and the luminance efficiency is improved.

According to an exemplary embodiment of the present disclosure, the emitting layer with high lowest triplet energy T1 and the electron block layer with high hole mobility are matched, which not only increases holes and prolongs the service life, but also increases the effective triplet exciton probability, increases the concentration of effective emitting excitons and improves the efficiency.

The present disclosure further provides a display apparatus including the aforementioned organic light emitting device. The display apparatus may be any product or component with a display function such as a mobile phone, a tablet computer, a television, a display, a laptop, a digital photo frame, a navigator, a vehicle-mounted display, a smart watch, a smart wristband, etc.

Although the embodiments disclosed in the present disclosure are as described above, the described contents are only the embodiments for facilitating understanding of the present disclosure, which are not intended to limit the present disclosure. Any person skilled in the field to which the present application pertains can make any modifications and variations in the forms and details of implementation without departing from the spirit and the scope disclosed in the present application, but the patent protection scope of the present application should still be subject to the scope defined by the appended claims.

What is claimed is:

1. An organic light emitting device, comprising an anode, a cathode, and an emitting layer disposed between the anode and the cathode, an electron block layer being disposed between the emitting layer and the anode, and a hole block layer being disposed between the emitting layer and the cathode; wherein the emitting layer comprises a host material and a dopant material doped in the host material; the host material comprises a first host material and a second host material, and the first host material, the second host material, the electron block layer, and the hole block layer satisfy:

|HOMO$_{1\text{-}host}$-HOMO$_{EBL}$|≤0.2 eV,|LUMO$_{HBL}$-LUMO$_{2\text{-}host}$|≤0.2 eV, wherein HOMO$_{1\text{-}host}$ is a highest occupied molecular orbital HOMO energy level of the first host material; HOMO$_{EBL}$ is a HOMO energy level of the electron block layer; LUMO$_{2\text{-}host}$ is a lowest unoccupied molecular orbital LUMO energy level of the second host material, and LUMO$_{HBL}$ is a LUMO energy level of the hole block layer.

2. The organic light emitting device of claim 1, wherein the host material and the hole block layer satisfy:

|LUMO$_{HBL}$-LUMO$_{1\text{-}host}$|=0.3 eV to 0.4 eV, wherein, LUMO$_{1\text{-}host}$ is a LUMO energy level of the first host material.

3. The organic light emitting device of claim 1, wherein the second host material and the hole block layer satisfy:

|HOMO$_{HBL}$-HOMO$_{2\text{-}host}$|≥0.3 eV, wherein HOMO$_{HBL}$ is a HOMO energy level of the hole block layer and HOMO$_{2\text{-}host}$ is a HOMO energy level of the second host material.

4. The organic light emitting device of claim 1, wherein hole mobility of the electron block layer is greater than electron mobility of the electron block layer.

5. The organic light emitting device of claim 4, wherein, the hole mobility of the electron block layer is $10^{-4}$ cm$^2$/Vs to $10^{-6}$ cm$^2$/Vs, and the electron mobility of the electron block layer is less than $10^{-8}$ cm$^2$/Vs.

6. The organic light emitting device of claim 1, wherein the hole mobility of the electron block layer is greater than 10 times that of the first host material.

7. The organic light emitting device of claim 1, wherein the hole mobility of the electron block layer is greater than electron mobility of the second host material.

8. The organic light emitting device of claim 1, wherein electron mobility of the hole block layer is greater than hole mobility of the hole block layer.

9. The organic light emitting device of claim 1, wherein the hole mobility of the first host material is $10^{-5}$cm$^2$/Vs to $10^{-7}$cm$^2$/Vs, the electron mobility of the second host material is $10^{-8}$cm$^2$/Vs to $10^{-9}$cm$^2$/Vs, and the electron mobility of the hole block layer is $10^{-7}$cm$^2$ to $10^{-9}$cm$^2$.

10. The organic light emitting device of claim 1, wherein in the host material, a mixing ratio of the first host material and the second host material is 2:8 to 8:2.

11. The organic light emitting device of claim 1, wherein the first host material comprises a p-type emitting material, and the second host material comprises an n-type emitting material.

12. The organic light emitting device of claim 1, wherein a material of the electron block layer comprises a compound having the following structural formula:

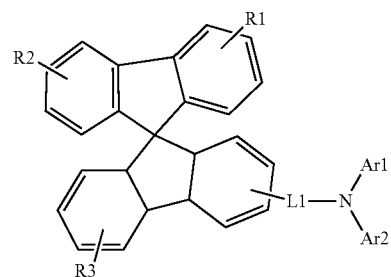

wherein Ar1 to Ar2 are independently substituted or unsubstituted aryl group with 6-30 ring carbon atoms or substituted or unsubstituted heteroaryl group with 5-20 ring atoms, and at least one of them is methyl fluorene, dibenzofuran or thiophene; L1 is a single bond or substituted aryl containing 6-30 carbon atoms; R1 to R3 are independently substituted or unsubstituted alkyl or aryl with 1-30 ring carbon atoms, or substituted or unsubstituted heteroaryl with 5-20 ring atoms.

13. The organic light emitting device of claim 1, wherein a material of the electron block layer comprises one or more compounds having the following structural formulas:

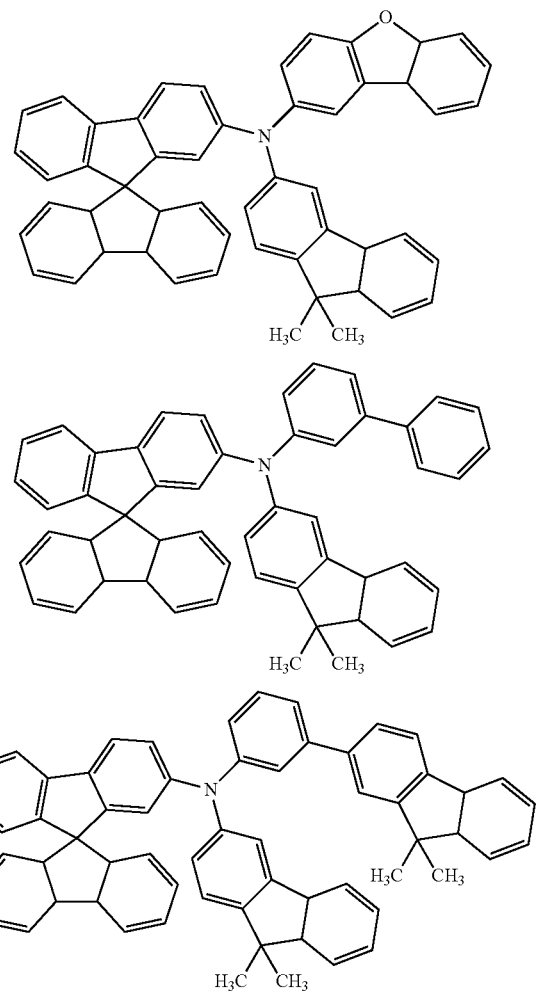

-continued

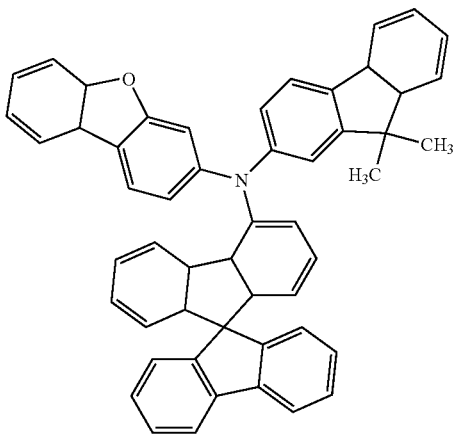

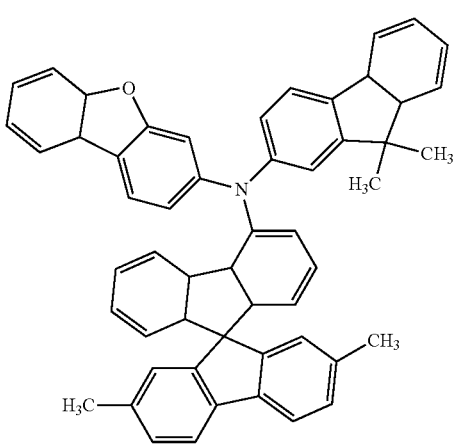

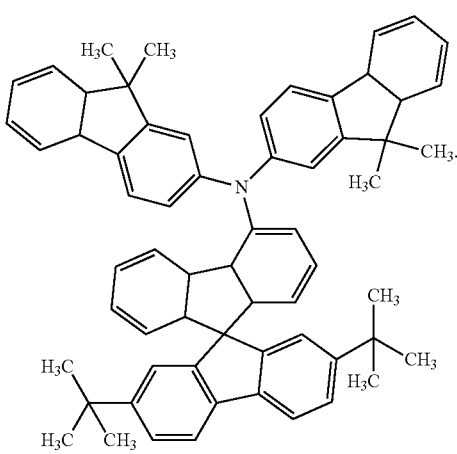

14. The organic light emitting device of claim 1, wherein the first host material comprises a compound having the following structural formula:

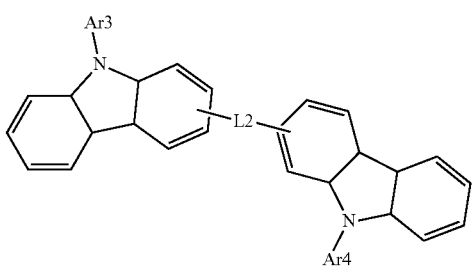

wherein Ar3 to Ar4 are independently substituted or unsubstituted C6-C30 aryl, substituted or unsubstituted heteroaryl, aryl or heteroaryl containing silicon, cyano, halogen or deuterium; L2 is a single bond or substituted or unsubstituted aryl containing 6-30 carbon atoms.

15. The organic light emitting device of claim 1, wherein the first host material comprises one or more of the compounds having the following structural formulas:

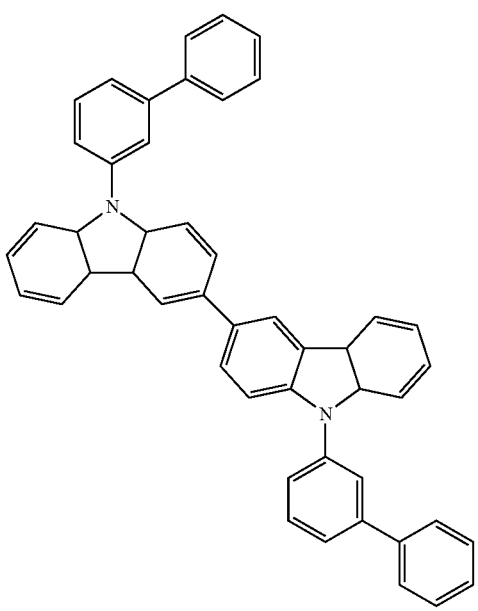

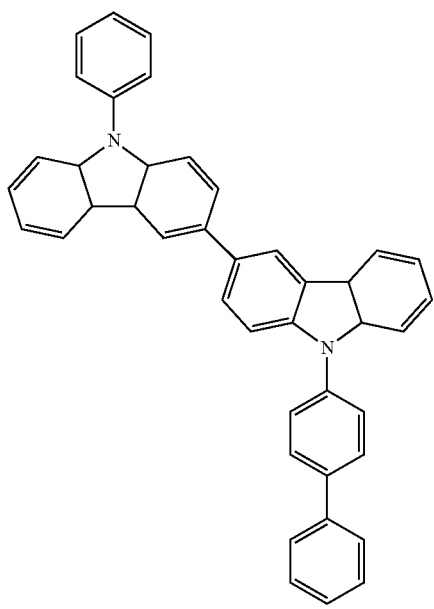
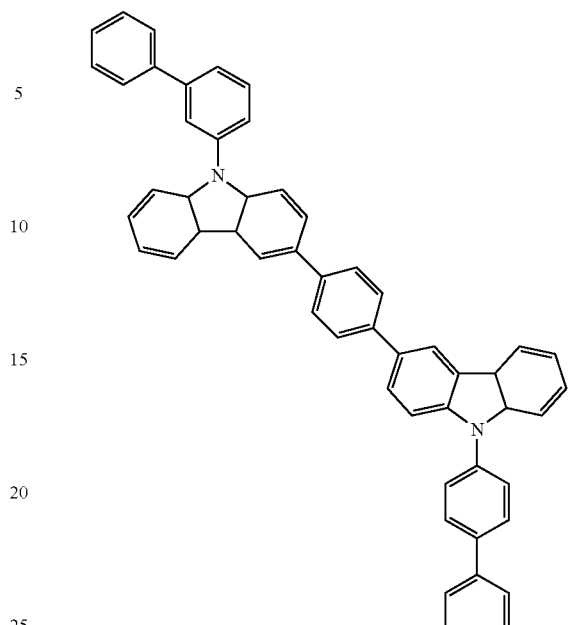
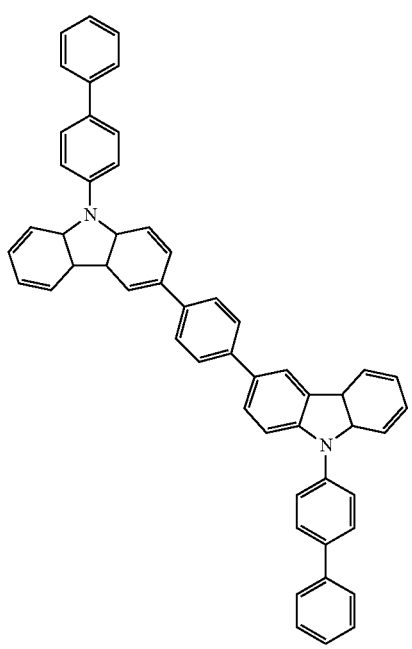
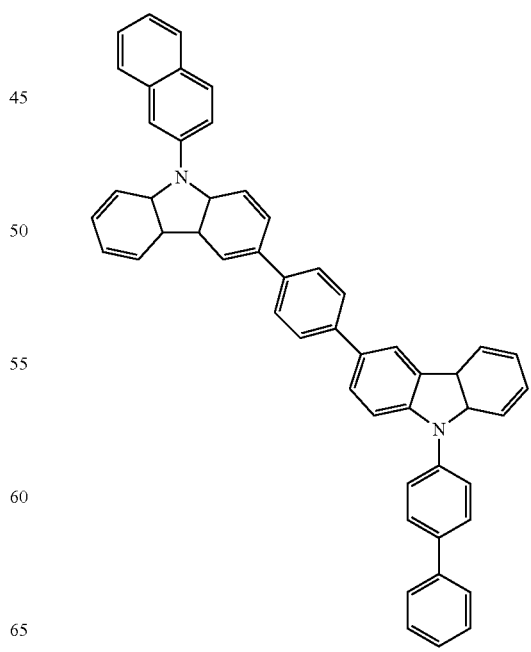

-continued

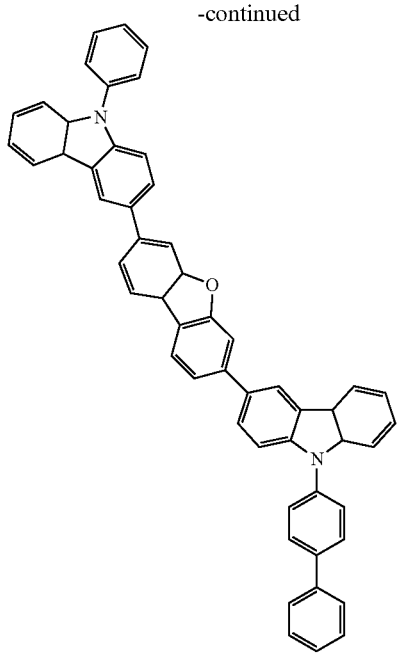

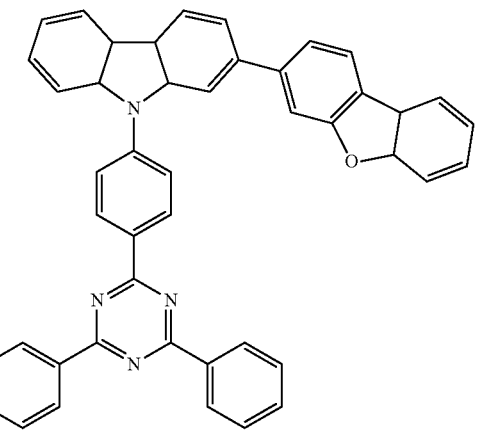

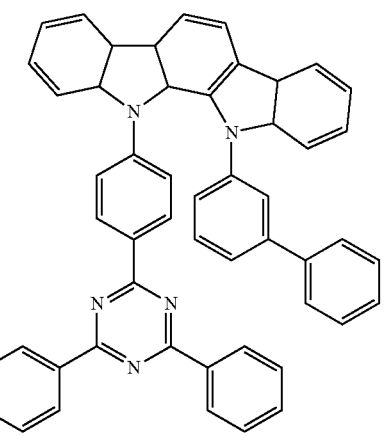

16. The organic light emitting device of claim 1, wherein the second host material comprises a compound having the following structural formula:

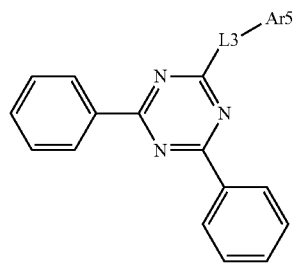

wherein Ar5 is substituted or unsubstituted aryl or heteroaryl with 6-30 carbon atoms, or contains carbazole, dibenzofuran and thiophene; L3 is aryl with 6-20 carbon atoms.

17. The organic light emitting device of claim 1, wherein the second host material comprises one or more of the compounds having the following structural formulas:

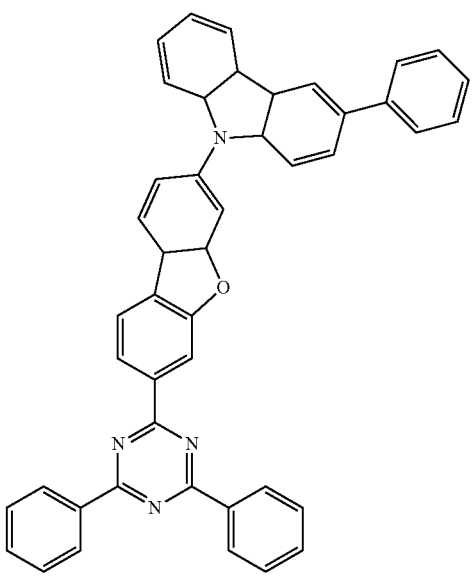

-continued

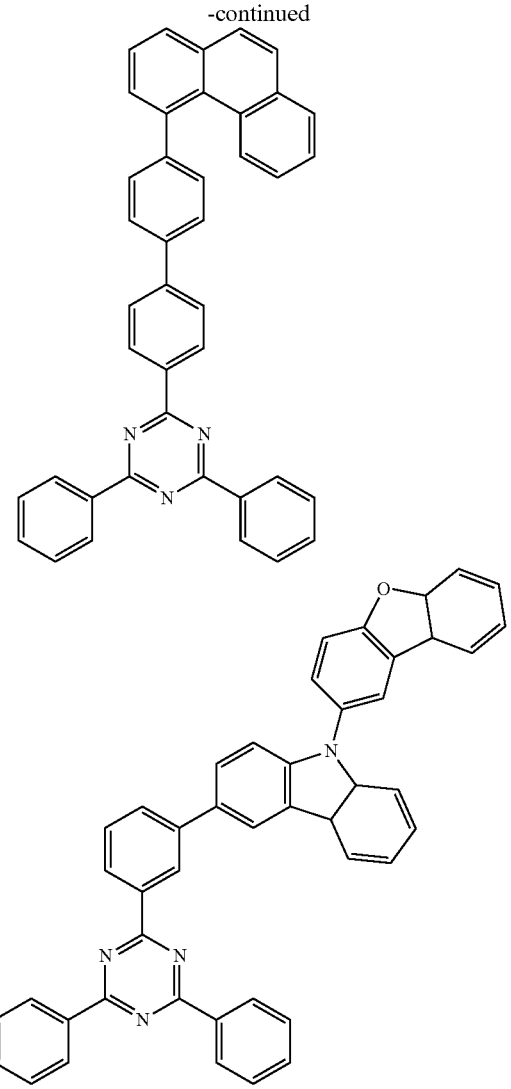

18. A display apparatus comprising the organic light emitting device of claim 1.

19. The organic light emitting device of claim 2, wherein a material of the electron block layer comprises a compound having the following structural formula:

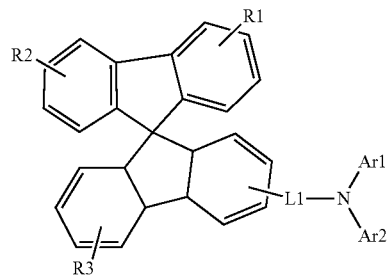

wherein Ar1 to Ar2 are independently substituted or unsubstituted aryl group with 6-30 ring carbon atoms or substituted or unsubstituted heteroaryl group with 5-20 ring atoms, and at least one of them is methyl fluorene, dibenzofuran or thiophene; L1 is a single bond or substituted aryl containing 6-30 carbon atoms; R1 to R3 are independently substituted or unsubstituted alkyl or aryl with 1-30 ring carbon atoms, or substituted or unsubstituted heteroaryl with 5-20 ring atoms.

20. The organic light emitting device of claim 1, wherein the first host material comprises a compound having the following structural formula:

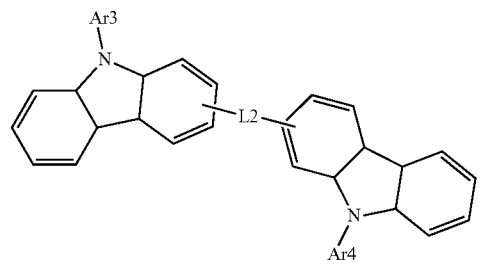

wherein Ar3 to Ar4 are independently substituted or unsubstituted C6-C30 aryl, substituted or unsubstituted heteroaryl, aryl or heteroaryl containing silicon, cyano, halogen or deuterium; L2 is a single bond or substituted or unsubstituted aryl containing 6-30 carbon atoms.

* * * * *